US007026079B2

(12) United States Patent
Louwet et al.

(10) Patent No.: US 7,026,079 B2
(45) Date of Patent: Apr. 11, 2006

(54) PROCESS FOR PREPARING A SUBSTANTIALLY TRANSPARENT CONDUCTIVE LAYER CONFIGURATION

(75) Inventors: Frank Louwet, Diepenbeek (BE); Tom Cloots, Londerzeel (BE); Hieronymus Andriessen, Beerse (BE)

(73) Assignee: AGFA Gevaert, Mortsel (BE)

( * ) Notice: Subject to any disclaimer, the term of this patent is extended or adjusted under 35 U.S.C. 154(b) by 118 days.

(21) Appl. No.: 10/645,160

(22) Filed: Aug. 21, 2003

(65) Prior Publication Data

US 2005/0042556 A1 Feb. 24, 2005

Related U.S. Application Data

(60) Provisional application No. 60/411,556, filed on Sep. 18, 2002.

(30) Foreign Application Priority Data

Aug. 22, 2002 (EP) .................. PCT/EP02/09429

(51) Int. Cl.
G03C 1/89 (2006.01)
G03C 5/29 (2006.01)
G03C 8/28 (2006.01)
G03C 8/52 (2006.01)
G03C 8/32 (2006.01)

(52) U.S. Cl. .................. 430/14; 430/244; 430/247; 430/248; 430/311; 430/319; 430/403; 430/432; 430/527; 430/529

(58) Field of Classification Search ............... 430/244, 430/247, 248, 14, 311, 319, 527, 529, 403, 430/432
See application file for complete search history.

(56) References Cited

U.S. PATENT DOCUMENTS 3,464,822 A * 9/1969 Blake ..................... 430/311

(Continued)

FOREIGN PATENT DOCUMENTS

| DE | 19 38 373 A | 2/1971 |
| DE | 196 27 071 A1 | 1/1998 |
| EP | 0 510 541 B1 | 10/1992 |
| GB | 1055073 | 1/1967 |
| WO | WO 98/54767 A1 | 12/1998 |

OTHER PUBLICATIONS

International Search Report PCT/EP02/09429 (May 6, 2003).

*Primary Examiner*—Richard L. Schilling
(74) *Attorney, Agent, or Firm*—Leydig, Voit & Mayer, Ltd.

(57) ABSTRACT

A process for preparing a substantially transparent conductive layer configuration on a support, the layer configuration comprising in any order at least a first layer containing an intrinsically conductive polymer optionally containing structural units represented by formula (I):

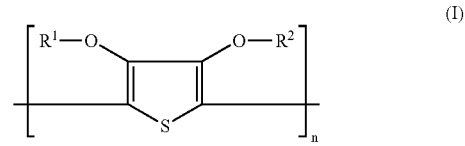

Figure 1:
Figure 1:
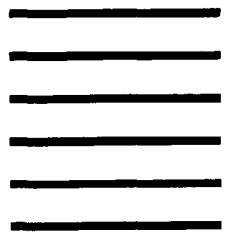
Figure 1:
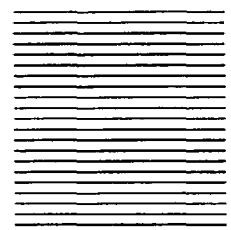
Figure 1:
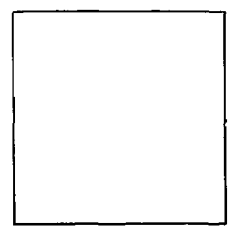

wherein n is larger than 1 and each of $R^1$ and $R^2$ independently represents hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group; and a second layer consisting of a non-continuous layer of conductive silver, the process comprising the step of: preparing the second layer by a photographic process; and light emitting diodes, photovoltaic devices, transistors and electroluminescent devices comprising a layer configuration prepared according to this process.

52 Claims, 3 Drawing Sheets

U.S. PATENT DOCUMENTS

| | | |
|---|---|---|
| 3,600,185 A | 8/1971 | McGuckin |
| 3,664,837 A | 5/1972 | Stanley |
| 4,192,640 A * | 3/1980 | Merry ..................... 430/248 |
| 5,447,824 A | 9/1995 | Mutsaers et al. |
| 5,858,581 A * | 1/1999 | Stephenson ................... 430/7 |
| 6,376,105 B1 * | 4/2002 | Jonas et al. ................. 428/690 |
| 6,444,400 B1 * | 9/2002 | Cloots et al. ............... 430/311 |
| 2002/0009680 A1 * | 1/2002 | Majumdar et al. .......... 430/527 |
| 2002/0123013 A1 * | 9/2002 | Viaene et al. ............... 430/522 |
| 2004/0149962 A1 * | 8/2004 | Andriessen ................. 252/500 |

\* cited by examiner a b c d

PROCESS FOR PREPARING A SUBSTANTIALLY TRANSPARENT CONDUCTIVE LAYER CONFIGURATION

This application claims the benefit of U.S. Provisional Application No. 60/411,556 filed Sep. 18, 2002, which is incorporated by reference. In addition, this application claims the benefit of International Application No. PCT/EP 02/09429 filed Aug. 22, 2002, which is also incorporated by reference.

FIELD OF THE INVENTION

The present invention relates to a process for producing a substantially transparent conductive layer configuration.

BACKGROUND OF THE INVENTION

In many applications there is a requirement for inexpensive transparent conducting layers, but a busbar will be also required for some of the (large area) applications. Highly conductive (non-transparent) patterns can be made by screen-printing conducting pastes such as silver or carbon black pastes. Vacuum evaporation of metals through shadow masks is another method. Yet another method makes use of homogeneous conductive metallized surfaces which can be patterned by use of photoresist technology in combination with a metal etching agent. Photographic films can, under certain conditions, be used for making electrically conductive-silver "images".

U.S. Pat. No. 3,664,837 describes the use of light sensitive evaporated silver halide film which upon exposure and after development results in conductive images. DE 1,938,373 describes a photographic method for producing conducting paths, resistances and capacitors for microcircuits starting from coated silver halide emulsions. U.S. Pat. No. 3,600,185 describes the production of electrically conductive patterns by means of diffusion transfer techniques.

DE-A 1938373 discloses a process for manufacturing passive elements such as resistances, capacitors, RC-components and conductive track by negative development with the aid of a light-sensitive multilayer silver halide material, comprising a non-conductive support and two different spectrally sensitized gelatin-containing silver chlorobromide emulsions one above another with a gelatin/silver ratio of at least 1:3, which are separated by a photographic bath permeable dielectric layer, which are developed in the presence of a known development booster.

Combinations of a transparent polymer-based conductor and a high conductive (non-transparent) pattern are described in some publications.

DE-A 196 27 071 discloses an electroluminescent configuration, which contains hole and/or electron injecting layers, wherein the polymeric organic conductor is selected from the group of polyfurans, polypyrroles, polyanilines, polythiophenes and polypyridines. DE-A 196 27 071 also discloses the use of poly(3,4-ethylenedioxythiophene) as a charge-injection layer on transparent metallic electrodes such as ITO (indium-tin oxide) and that the following materials are suitable as transparent and conductive materials: a) metal oxides e.g. ITO, tin oxide etc.; b) semi-transparent metal films e.g. Au, Pt, Ag, Cu etc. The latter being applied by vacuum techniques.

EP-A 510 541 discloses an organic electroluminescent device having an anode, an organic hole injection transport layer, an organic luminescent layer and a cathode formed sequentially in this order, wherein the organic hole injection transport layer contains a metal complex and/or a metal salt of an aromatic carboxylic acid. EP-A 510 541 further discloses that the conductive layers used in such devices may have a multi-layer structure by depositing different types of conductive materials selected from a metal, e.g. Al, Au, Ag, Ni, Pd or Te, a metal oxide, carbon black or a conductive resin such as poly(3-methylthiophene), but no specific combinations are exemplified.

U.S. Pat. No. 5,447,824 discloses a method of manufacturing a pattern of an electrically conductive polymer on a substrate surface, said method comprising: a) forming a liquid layer on a surface of said substrate from a solution containing a material capable of forming said electrically conductive polymer upon being heated, e.g. 3,4-ethylenedioxythiophene, an oxidizing agent and a base, b) exposing said liquid layer to patterned radiation, and c) heating said layer thereby forming a pattern of an electrically conductive polymer, said conductive polymer being formed in unexposed areas and a non-conductive polymer being formed in the exposed areas of the layer. The galvanic provision of the conductive polymer pattern with a metal layer, e.g. silver, copper, nickel or chromium, is also disclosed in U.S. Pat. No. 5,447,824.

WO 98/54767 discloses a conductive layer system, particularly for a transparent or semi-transparent electrode or electroluminescent configuration, comprising at least two layers, characterized in that the first layer contains an organic or organometallic electrically conductive polymer, which is transparent or semi-transparent in the visible range of the electromagnetic spectrum, e.g. a polymer selected from the group consisting of polythiophene, polypyrrole, polyaniline, polyacetylene or their optionally substituted derivatives and the second layer contains at least one electrically conductive inorganic compound or a metal or an appropriately doped semi-metal e.g. a material selected from the group consisting of Cu, Ag, Au, Pt, Pd, Fe, Cr, Sn, Al or their alloys or conductive carbon. In a preferred embodiment the second layer is a conductive pattern formed by an open grid structure, preferably with a 5–500 µm grid so that it cannot be perceived by the human eye. Invention example 2 discloses a poly(3,4-ethylenedioxythiophene)[PEDOT]/poly(styrene sulphonate)[PSS] layer with a surface resistivity of 1500 Ω/square to which conducting tracks of Leitsilber™ (a silver particle dispersion) ca. 2 mm wide had been applied by a printing technique.

The layer configuration disclosed in Example 2 of WO 98/54767 has the disadvantages of the grid of Leitsilber™ requiring a thickness of 5 to 10 µm to realize layers with a surface resistance of 0.5 to 1 Ω/square, which means that the surface of the configuration will have a certain roughness which will limit its applications, making it difficult to apply a thin, e.g. 100 nm, functional layer. Furthermore, an aqueous PEDOT/PSS dispersion would not wet such a Leitsilber™ grid and hence a usable multilayer conductive configuration would not result.

Furthermore, such a reversed order: first a conductive metal grid and then a conductive transparent polymeric layer will certainly be of more importance in LED devices and thin film photovoltaic devices, in which the transparent polymeric electrode performs as a hole-injecting layer.

ASPECTS OF THE INVENTION

It is therefore an aspect of the present invention to provide a process for preparing a multilayer electrode configuration comprising a conductive polymer layer and a conductive metal layer in which it is possible to realize either the conductive polymer layer or the conductive metal layer nearer the support.

It is a further aspect of the present invention to provide a process for preparing a multilayer electrode configuration comprising a conductive polymer layer and a conductive metal layer in which it is possible to apply a functional layer system.

It is also an aspect of the present invention to prevent ion migration from the conductive electrode.

Further aspects and advantages of the invention will become apparent from the description hereinafter.

SUMMARY OF THE INVENTION

It has been surprisingly found that by preparing the silver grid in a multilayer configuration comprising a first layer containing an intrinsically conductive polymer, such as PEDOT/PSS, and a second layer which is a silver pattern using a photographic process enables a configuration to be realized with the PEDOT/PSS layer or the silver pattern outermost such that functional layers can be readily applied to its outermost layer.

Aspects of the present invention are realized by a process for preparing a substantially transparent conductive layer configuration on a support, the layer configuration comprising in any order at least a first layer containing an intrinsically conductive polymer and a second layer consisting of a non-continuous layer of conductive silver, the process comprising the step of: preparing the second layer by a photographic process.

Aspects of the present invention are also realized by a layer configuration obtainable by the process, according to the present invention, wherein the layer configuration further contains a 1-phenyl-5-mercapto-tetrazole compound in which the phenyl group is substituted with at least one electron accepting group.

Aspects of the present invention are also realized by a light emitting diode comprising a layer configuration prepared according to the above-mentioned process.

Aspects of the present invention are also realized by a photovoltaic device comprising a layer configuration prepared according to the above-mentioned process.

Aspects of the present invention are also realized by a transistor comprising a layer configuration prepared according to the above-mentioned process.

Aspects of the present invention are also realized by an electroluminescent device comprising a layer configuration prepared according to the above-mentioned process.

Preferred embodiments are disclosed in the dependent claims.

DETAILED DESCRIPTION OF THE INVENTION

FIG. 1 shows four silver patterns, pattern (a) representing a continuous silver layer 3×3 cm² in area, pattern (b) representing a regular strip pattern, the parallel strips being 10 mm apart and having a width of 1 mm; pattern (c) representing a regular strip pattern, the parallel strips being 5 mm apart and having a width of 150 μm; and pattern (d) representing no silver development.

Figure 2:
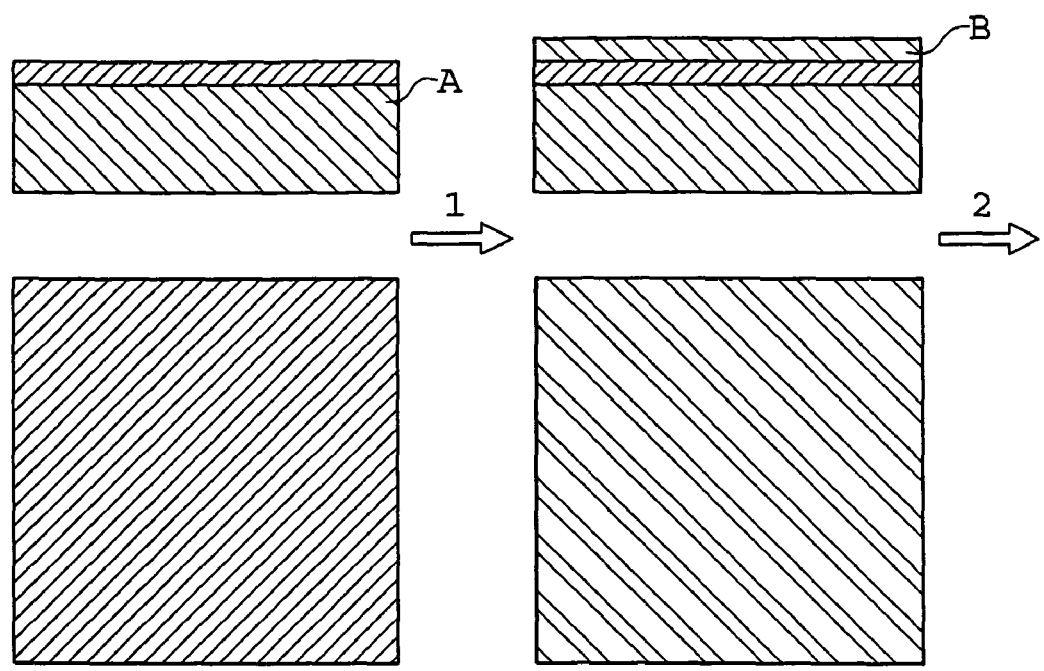
Figure 1:
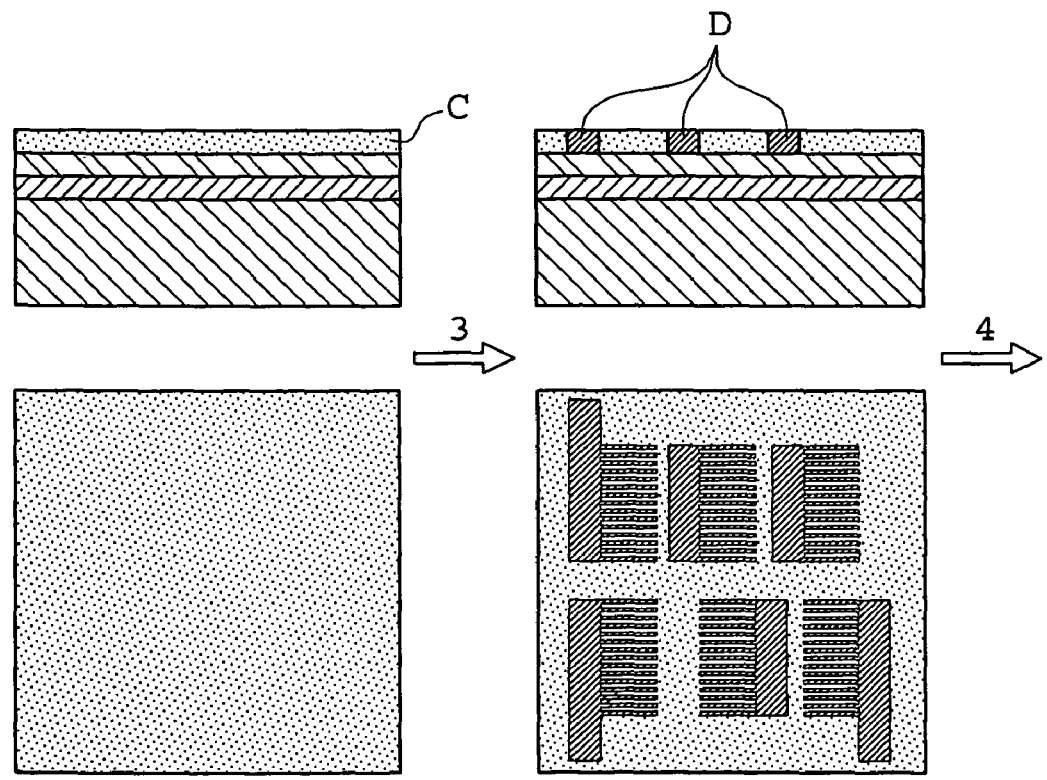
Figure 2:
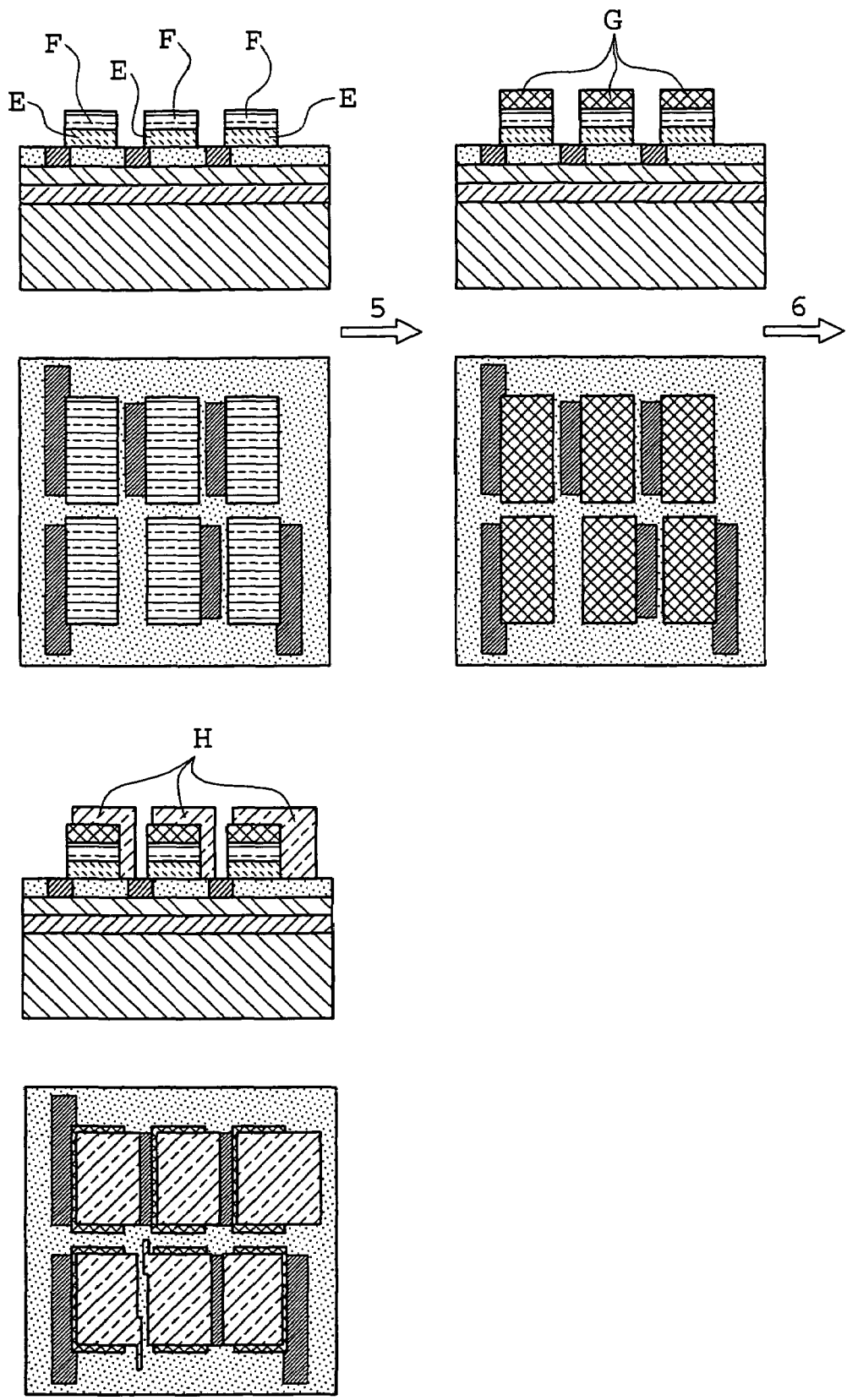

FIG. 2 shows side (upper) and top (lower) views of a sequential process for building up a module with a separate photovoltaic cell, two serially connected photovoltaic cells and three serially connected photovoltaic cells using a six step process in which: A=a subbed support; B=a gelatin layer; C=a palladium sulphide nucleation layer; D=a conductive silver pattern; E=a highly conductive PEDOT/PSS-layer; F=a shunt resistance hindering layer; G=a photovoltaic blend; and H=a lithium fluoride/aluminium electrode. In step 1 in which the subbed surface of a subbed poly(ethylene terephthalate) film A [the subbing layer represented by hatching] is coated with a gelatin layer B; step 2 in which a palladium sulfide nucleation layer C is applied to the gelatin layer B; step 3 in which a diffusion transfer process is carried out in which a conductive silver pattern D is produced; step 4 in which the conductive silver pattern D is coated with a highly conductive PEDOT/PSS-layer E by e.g. screen printing, and optionally additionally with a shunt resistance hindering layer F, e.g. a PEDOT/PSS layer or a PEDOT-S/polycationic or polyanionic polymer with a higher surface resistance; step 5 in which layer E or F is coated with a photovoltaic blend, e.g. a blend of MDMO-PPV/PCBM G, by e.g. curtain coating, spin-coating or screen printing; and step 6 in which layer G is coated with a non-continuous lithium fluoride/aluminium layer forming a top electrode H.

DEFINITIONS

The term alkyl means all variants possible for each number of carbon atoms in the alkyl group i.e. for three carbon atoms: n-propyl and isopropyl; for four carbon atoms: n-butyl, isobutyl and tertiary-butyl; for five carbon atoms: n-pentyl, 1,1-dimethyl-propyl, 2,2-dimethylpropyl and 2-methyl-butyl etc.

The term aqueous for the purposes of the present invention means containing at least 60% by volume of water, preferably at least 80% by volume of water, and optionally containing water-miscible organic solvents such as alcohols e.g. methanol, ethanol, 2-propanol, butanol, iso-amyl alcohol, octanol, cetyl alcohol etc.; glycols e.g. ethylene glycol; glycerine; N-methyl pyrrolidone; methoxypropanol; and ketones e.g. 2-propanone and 2-butanone etc.

The term "support" means a "self-supporting material" so as to distinguish it from a "layer" which may be coated on a support, but which is itself not self-supporting. It also includes any treatment necessary for, or layer applied to aid, adhesion to the support.

The term continuous layer refers to a layer in a single plane covering the whole area of the support and not necessarily in direct contact with the support.

The term non-continuous layer refers to a layer in a single plane not covering the whole area of the support and not necessarily in direct contact with the support.

The term coating in used as a generic term including all means of applying a layer including all techniques for producing continuous layers, such as curtain coating, doctor-blade coating etc., and all techniques for producing non-continuous layers such as screen printing, ink jet printing, flexographic printing, and techniques for producing continuous layers The term intrinsically conductive polymer means organic polymers which have (poly)-conjugated π-electron systems (e.g. double bonds, aromatic or heteroaromatic rings or triple bonds) and whose conductive properties are not influenced by environmental factors such as relative humidity.

The term "conductive" is related to the electric resistance of the material. The electric resistance of a layer is generally expressed in terms of surface resistance $R_s$ (unit Ω; often specified as Ω/square). Alternatively, the conductivity may be expressed in terms of volume resistivity $R_v = R_s \cdot d$, wherein d is the thickness of the layer, volume conductivity $k_v=1/R_v$ [unit: S(iemens)/cm] or surface conductance $k_s=1/R_s$ [unit: S(iemens).square].

The term photographic refers to any photochemical process particularly those based on silver halide processes.

The term silver salt diffusion transfer process refers to a process developed independently by A. Rott [GB 614,155 and Sci. Photogr., (2)13, 151 (1942)] and E. Weyde [DE 973,769] and described by G. I. P. Levenson in Chapter 16 of "The Theory of the Photographic Process Fourth Edition", edited by T. H. James, pages 466 to 480, Eastman Kodak Company, Rochester (1977).

The term substantially transparent means that the integral transmission of visible light is above 40% of the incident light normal to the layer configuration of the present invention i.e. the layer had an overall optical density of less than 0.40, although local transmission of visible light though the lines of the silver pattern may be well below 10% of the incident light normal to the layer configuration of the present invention i.e. well above an optical density of 1.0.

The abbreviation PEDOT represents poly(3,4-ethylene-dioxy-thiophene).

The abbreviation PSS represents poly(styrene sulphonic acid) or poly(styrenesulphonate).

The abbreviation PEDOT-S represents poly[4-(2,3-dihydro-thieno[3,4-b][1,4]dioxin-2-ylmethoxy)-butane-1-sulphonic acid].

Process for Preparing a Layer Configuration

Aspects of the present invention are realized by a process for preparing a substantially transparent conductive layer configuration on a support, the layer configuration comprising in any order at least a first layer containing an intrinsically conductive polymer and a second layer consisting of a non-continuous layer of conductive silver, the process comprising the step of: preparing the second layer by a photographic process.

According to a first embodiment of the process, according to the present invention the process further comprises coating the first layer prior to preparing the second layer by a photographic process.

According to a second embodiment of the process, according to the present invention, the photographic process comprises the steps of: coating the support with a layer containing silver halide and gelatin with a weight ratio of gelatin to silver halide in the range of 0.05 to 0.3, image-wise exposing the silver halide-containing layer, and developing the exposed silver halide-containing layer to produce the second layer.

According to a third embodiment of the process, according to the present invention, the process comprises the steps of: coating the support with the first layer, coating the first layer with a layer containing silver halide and gelatin with a weight ratio of gelatin to silver halide in the range of 0.05 to 0.3, image-wise exposing the silver halide-containing layer, and developing the exposed silver halide-containing layer to produce the second layer.

According to a fourth embodiment of the process, according to the present invention, the process comprises the steps of: coating the support a layer containing silver halide and gelatin with a weight ratio of gelatin to silver halide in the range of 0.05 to 0.3, coating the silver halide-containing layer with the first layer, image-wise exposing the silver halide-containing layer, and developing the exposed silver halide-containing layer to produce the second layer.

According to a fifth embodiment of the process, according to the present invention, the process comprises the steps of: coating the support with a layer containing silver halide and gelatin with a weight ratio of gelatin to silver halide in the range of 0.05 to 0.3, image-wise exposing the silver halide-containing layer, developing the exposed silver halide-containing layer to produce the second layer, and coating the second layer with the first layer.

According to a sixth embodiment of the process, according to the present invention, the photographic process comprises the steps of: coating the support with a non-continuous layer of a nucleation agent; producing the second layer on the non-continuous nucleation layer using silver salt diffusion transfer.

According to a seventh embodiment of the process, according to the present invention, the photographic process comprises the steps of: coating the support with the first layer, coating the first layer with a layer of a nucleation agent; producing a non-continuous silver layer on the nucleation layer using silver salt diffusion transfer.

According to an eighth embodiment of the process, according to the present invention, the photographic process comprises the steps of: coating the support with a non-continuous layer of a nucleation agent; coating the non-continuous layer of a nucleation agent with the first layer; and producing a non-continuous silver layer on the non-continuous nucleation layer using silver salt diffusion transfer.

According to a ninth embodiment of the process, according to the present invention, the photographic process comprises the steps of: coating the support with a non-continuous layer of palladium sulphide, e.g. palladium sulphide nano-particles, as nucleation agent; producing a non-continuous silver layer on the non-continuous nucleation layer using silver salt diffusion transfer.

According to a tenth embodiment of the process, according to the resent invention, the process comprises the steps of: coating the support with a non-continuous layer of a nucleation agent; producing the second layer on the non-continuous nucleation layer using silver salt diffusion transfer; and coating the second layer with the first layer.

According to an eleventh embodiment of the process, according to the present invention, the first layer is applied by a printing process.

Intrinsically Conductive Polymer

The intrinsically conductive polymers used in the present invention can be any intrinsically conductive polymer known in the art e.g. polyacetylene, polypyrrole, polyaniline, polythiophene, etc. Details about suitable intrinsically conductive polymers can be found in textbooks, such as "Advances in Synthetic Metals", ed. P. Bernier, S. Lefrant, and G. Bidan, Elsevier, 1999; "Intrinsically Conducting Polymers: An Emerging Technology", Kluwer (1993); "Conducting Polymer Fundamentals and Applications, A Practical Approach", P. Chandrasekhar, Kluwer, 1999; and "Handbook of Organic Conducting Molecules and Polymers", Ed. Walwa, Vol. 1–4, Marcel Dekker Inc. (1997).

According to a twelfth embodiment of the process, according to the present invention, the intrinsically conductive polymer contains structural units represented by formula (I):

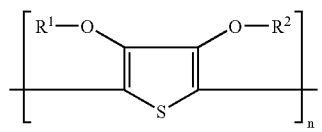

in which, each of $R^1$ and $R^2$ independently represents hydrogen or a $C_{1-4}$ alkyl group or together represent an optionally substituted $C_{1-4}$ alkylene group or a cycloalkylene group.

According to a thirteenth embodiment of the process, according to the present invention, the intrinsically conductive polymer is a polymer or copolymer of a 3,4-dialkoxythiophene in which the two alkoxy groups together represent an optionally substituted oxy-alkylene-oxy bridge.

According to a fourteenth embodiment of the process, according to the present invention, the intrinsically conductive polymer is a polymer or copolymer of a 3,4-dialkoxythiophenes in which the two alkoxy groups together represent an optionally substituted oxy-alkylene-oxy bridge and is selected from the group consisting of: poly(3,4-methylenedioxythiophene), poly(3,4-methylenedioxy-thiophene) derivatives, poly(3,4-ethylenedioxythiophene), poly(3,4-ethylene-dioxythiophene) derivatives, poly(3,4-propylenedioxy-thiophene), poly(3,4-propylenedioxy-thiophene) derivatives, poly(3,4-butylene-dioxythiophene) and poly(3,4-butylenedioxy-thiophene) derivatives and copolymers thereof.

According to a fifteenth embodiment of the process, according to the present invention, the intrinsically conductive polymer is a polymer or copolymer of a 3,4-dialkoxythiophenes in which the two alkoxy groups together represent an optionally substituted oxy-alkylene-oxy bridge and the substituents for the oxy-alkylene-oxy bridge are alkyl, alkoxy, alkyloxyalkyl, carboxy, alkylsulfonato and carboxy ester groups.

According to a sixteenth embodiment of the process, according to the present invention, the intrinsically conductive polymer is a polymer or copolymer of a 3,4-dialkoxythiophenes in which the two alkoxy groups together represent an optionally substituted oxy-alkylene-oxy bridge and the two alkoxy groups together represent an optionally substituted oxy-alkylene-oxy bridge which is a 1,2-ethylene group, an optionally alkyl-substituted methylene group, an optionally C1–12 alkyl- or phenyl-substituted 1,2-ethylene group, a 1,3-propylene group or a 1,2-cyclohexylene group.

Such polymers are disclosed in Handbook of Oligo- and Polythiophenes Edited by D. Fichou, Wiley-VCH, Weinheim (1999); by L. Groenendaal et al. in Advanced Materials, volume 12, pages 481–494 (2000); L. J. Kloeppner et al. in Polymer Preprints, volume 40(2), page 792 (1999); P. Schottland et al. in Synthetic Metals, volume 101, pages 7–8 (1999); and D. M. Welsh et al. in Polymer Preprints, volume 38(2), page 320 (1997).

Organic polymer containing structural units according to formula (I) can be polymerized chemically or electrochemically. Chemical polymerization can be carried out oxidatively or reductively. The oxidation agents used for the oxidative polymerisation of pyrrole, such as described for example in J. Amer. Chem. Soc., vol. 85, pages 454–458 (1963) and J. Polymer Science Part A Polymer Chemistry, vol. 26, pages 1287–1294 (1988), can be utilized for the oxidative polymerization of thiophenes. According to a seventh embodiment of the present invention, the inexpensive and easily accessible oxidation agents such as iron(III) salts such as $FeCl_3$, the iron(III) salts of organic acids, e.g. $Fe(OTs)_3$, $H_2O_2$, $K_2Cr_2O_7$, alkali and ammonium persulphates, alkali perborates and potassium permanganate are used in the oxidative polymerization.

Theoretically the oxidative polymerization of thiophenes requires 2.25 equivalents of oxidation agent per mole thiophene of formula (I) [see e.g. J. Polymer Science Part A Polymer Chemistry, vol. 26, pages 1287–1294 (1988)]. In practice an excess of 0.1 to 2 equivalents of oxidation agent is used per polymerizable unit. The use of persulphates and iron(III) salts has the great technical advantage that they do not act corrosively. Furthermore, in the presence of particular additives oxidative polymerization of the thiophene compounds according to formula (I) proceeds so slowly that the thiophenes and oxidation agent can be brought together as a solution or paste and applied to the substrate to be treated. After application of such solutions or pastes the oxidative polymerization can be accelerated by heating the coated substrate as disclosed in U.S. Pat. No. 6,001,281 and WO 00/14139 herein incorporated by reference.

Reductive polymerization can be performed using the Stille (organotin) or Suzuki (organoboron) routes described in 2002 by Appperloo et al. in Chem. Eur. Journal, volume 8, pages 2384–2396, and as disclosed in 2001 in Tetrahedron Letters, volume 42, pages 155–157 and in 1998 in Macromolecules, volume 31, pages 2047–2056 respectively or with nickel complexes as disclosed in 1999 in Bull. Chem. Soc. Japan, volume 72, page 621 and in 1998 in Advanced Materials, volume 10, pages 93–116.

1-Phenyl-5-mercapto-tetrazole Compound Substituted with at Least One Electron Accepting Group Aspects of the present invention are also realized by a layer configuration obtainable by the process, according to the present invention, wherein the layer configuration further contains a 1-phenyl-5-mercapto-tetrazole compound in which the phenyl group is substituted with at least one electron accepting group.

According to a first embodiment of the layer configuration conducting layer obtainable by the process, according to the present invention, the electron accepting group is selected from the group consisting of chloride, fluoride, cyano, sulfonyl, nitro, acid amido and acylamino groups.

According to a second embodiment of the layer configuration obtainable by the process, according to the present invention, the 1-phenyl-5-mercapto-tetrazole compound in which the phenyl group is substituted with at least one electron accepting group is selected from the group consisting of: 1-(3',4'-dichlorophenyl)-5-mercapto-tetrazole,

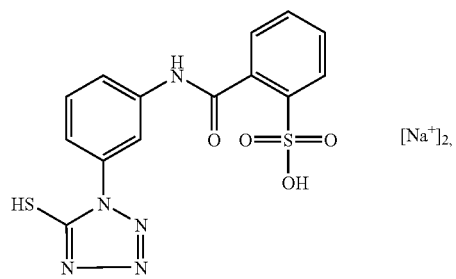

-continued
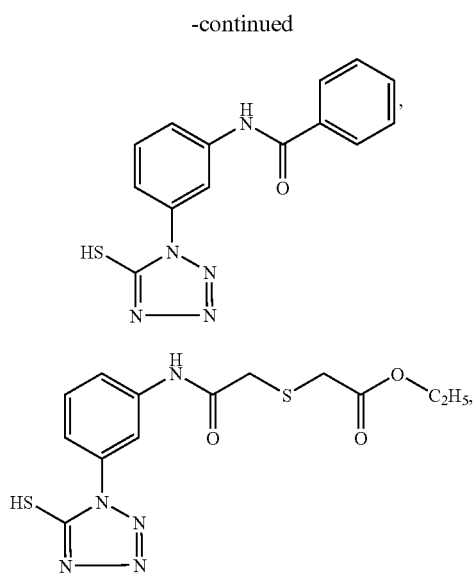
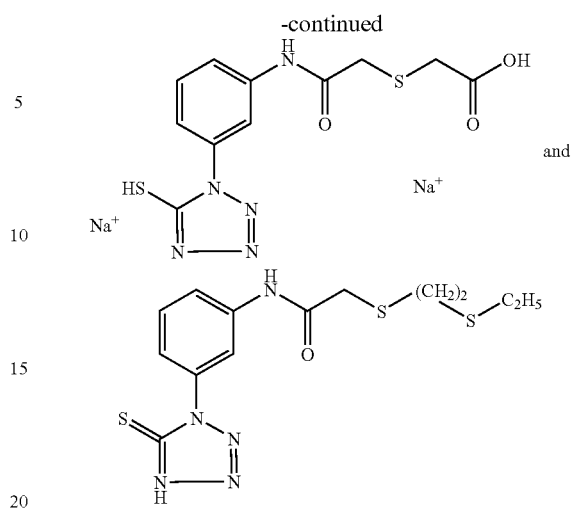
Suitable 1-phenyl-5-mercapto-tetrazole compounds with substituted phenyl groups [PMT], according to the present invention, include:
| | Structural formula | |
|---|---|---|
| PMT01 | 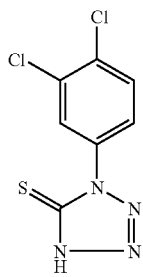 | 1-(3',4'-dichlorophenyl)-5-mercapto-tetrazole |
| PMT02 | 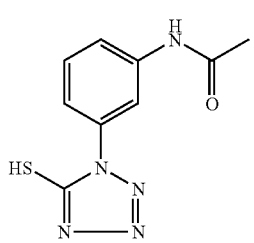 | 1-(3'-acetylamino-phenyl)-5-mercapto-tetrazole |
| PMT03 | 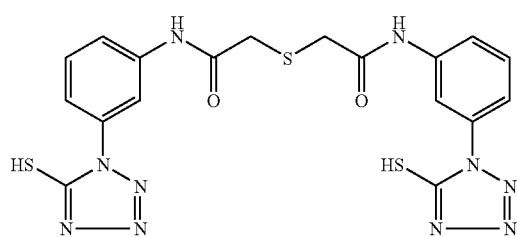 | |

-continued
| Structural formula |
|---|
| PMT04 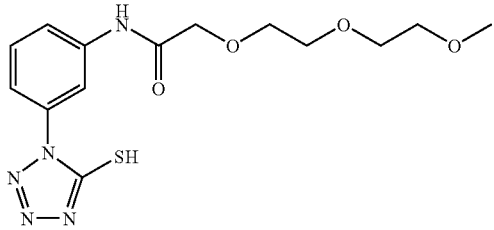 |
| PMT05 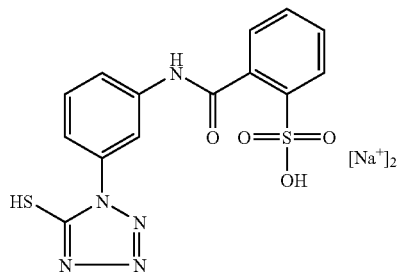 |
| PMT06 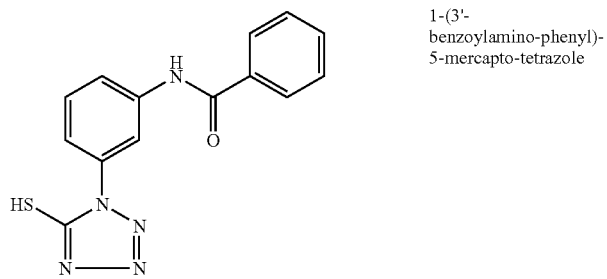     1-(3'-benzoylamino-phenyl)-5-mercapto-tetrazole |
| PMT07 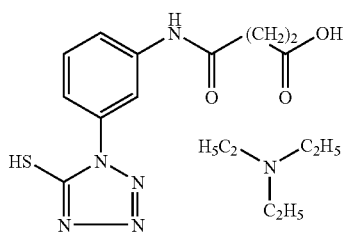 |
| PMT08 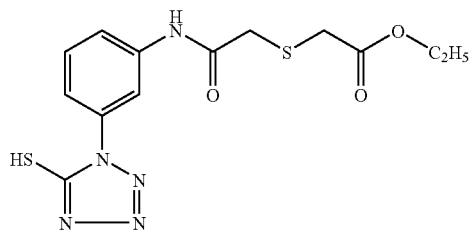 |
| PMT09 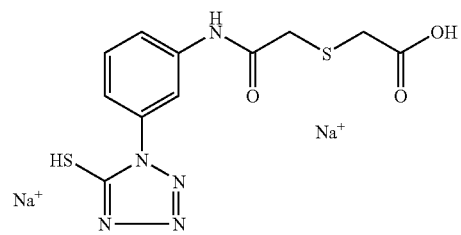 |

| Structural formula |
|---|
| PMT10 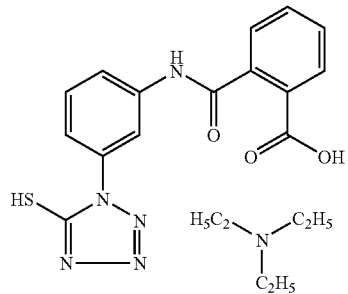 |
| PMT11 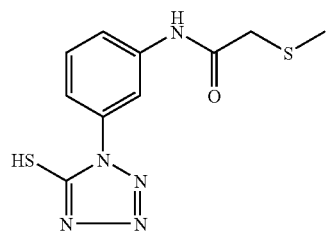 |
| PMT12 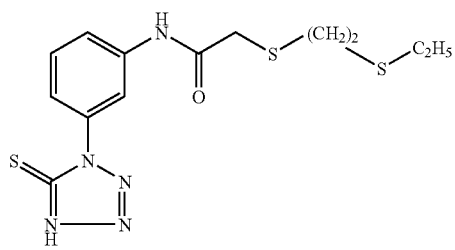 |
| PMT13 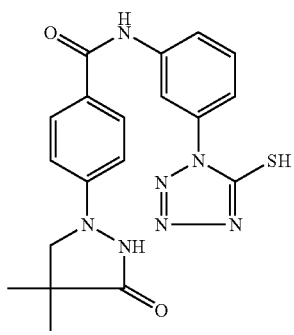 |
| PMT14 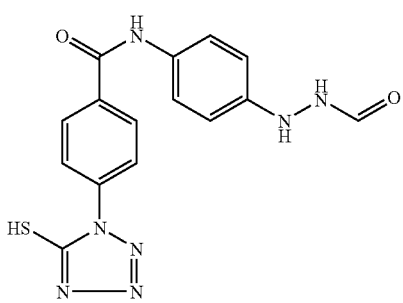 |

Printing inks containing an intrinsically conductive polymer

According to a seventeenth embodiment of the process, according to the present invention, the first layer is applied by a printing process using an ink or paste containing an intrinsically conductive polymer.

A printing ink or paste containing between 0.08 and 3.0% by weight of polymer or copolymer of a 3,4-dialkoxythiophene in which the two alkoxy groups may be the same or different or together represent an optionally substituted oxy-alkylene-oxy bridge, a polyanion and non-aqueous solvent can be prepared from a dispersion of the polymer or copolymer of (3,4-dialkoxythiophene) and the polyanion in water by a method comprising the steps of: i) mixing at least one non-aqueous solvent with the aqueous dispersion of the polymer or copolymer of (3,4-dialkoxythiophene) and the polyanion; and ii) evaporating water from the mixture prepared in step i) until the content of water therein is reduced by at least 65% by weight.

Surfactants

According to a third embodiment of the layer configuration, according to the present invention, the layer configuration further contains a surfactant.

According to a fourth embodiment of the layer configuration, according to the present invention, the layer configuration further contains a non-ionic surfactant e.g. ethoxylated/fluoro-alkyl surfactants, polyethoxylated silicone surfactants, polysiloxane/polyether surfactants, ammonium salts of perfluoro-alkylcarboxylic acids, polyethoxylated surfactants and fluorine-containing surfactants.

Suitable non-ionic surfactants include:
Surfactant no. 01=ZONYL™ FSN, a 40% by weight solution of $F(CF_2CF_2)_{1-9}CH_2CH_2O(CH_2CH_2O)_xH$ in a 50% by weight solution of isopropanol in water where x=0 to about 25, from DuPont;
Surfactant no. 02=ZONYL™ FSN-100: $F(CF_2CF_2)_{1-9}CH_2CH_2O(CH_2CH_2O)_xH$ where x=0 to about 25, from DuPont;
Surfactant no. 03=ZONYL™ FS300, a 40% by weight aqueous solution of a fluorinated surfactant, from DuPont;
Surfactant no. 04=ZONYL™ FSO, a 50% by weight solution of a mixture of ethoxylated non-ionic fluoro-surfactant with the formula: $F(CF_2CF_2)_{1-7}CH_2CH_2O(CH_2CH_2O)_yH$ where y=0 to ca. 15 in a 50% by weight solution of ethylene glycol in water, from DuPont;
Surfactant no. 05=ZONYL™ FSO-100, a mixture of ethoxylated non-ionic fluoro-surfactant from DuPont with the formula: $F(CF_2CF_2)_{1-7}CH_2CH_2O(CH_2CH_2O)_yH$ where y=0 to ca. 15 from DuPont;
Surfactant no. 06=Tegoglide™ 410, a polysiloxane-polymer copolymer surfactant, from Goldschmidt;
Surfactant no. 07=Tegowet™, a polysiloxane-polyester copolymer surfactant, from Goldschmidt;
Surfactant no. 08=FLUORAD™FC431: $CF_3(CF_2)_7SO_2(C_2H_5)N$—$CH_2CO$—$(OCH_2CH_2)_nOH$ from 3M;
Surfactant no. 09=FLUORAD™FC126, a mixture of the ammonium salts of perfluorocarboxylic acids, from 3M;
Surfactant no. 10=Polyoxyethylene-10-lauryl ether
Surfactant no. 11=FLUORAD™FC430, a 98.5% active fluoroaliphatic ester from 3M;

According to a fifth embodiment of the layer configuration, according to the present invention, the layer configuration further contains an anionic surfactant.

Suitable anionic surfactants include:
Surfactant no. 12=ZONYL™ 7950, a fluorinated surfactant, from DuPont;
Surfactant no. 13=ZONYL™ FSA, 25% by weight solution of $F(CF_2CF_2)_{1-9}CH_2CH_2SCH_2CH_2COOLi$ in a 50% by weight solution of isopropanol in water, from DuPont;
Surfactant no. 14=ZONYL™ FSE, a 14% by weight solution of $[F(CF_2CF_2)_{1-7}CH_2CH_2O]_xP(O)(ONH_4)_y$ where x=1 or 2; y=2 or 1; and x+y=3 in a 70% by weight aqueous ethylene glycol solution, from DuPont;
Surfactant no. 15=ZONYL™ FSJ, a 40% by weight solution of a blend of $F(CF_2CF_2)_{1-7}CH_2CH_2O]_xP(O)(ONH_4)_y$, where x=1 or 2; y=2 or 1; and x+y=3 with a hydrocarbon surfactant in 25% by weight solution of isopropanol in water, from DuPont;
Surfactant no. 16=ZONYL™ FSP, a 35% by weight solution of $[F(CF_2CF_2)_{1-7}CH_2CH_2O]_xP(O)(ONH_4)_y$ where x=1 or 2; y=2 or 1 and x+y=3 in 69.2% by weight solution of isopropanol in water, from DuPont;
Surfactant no. 17=ZONYL™ UR: $[F(CF_2CF_2)_{1-7}CH_2CH_2O]_xP(O)(OH)_y$ where x'1 or 2; y=2 or 1 and x+y=3, from DuPont;
Surfactant no. 18=ZONYL™ TBS: a 33% by weight solution of $F(CF_2CF_2)_{3-8}CH_2CH_2SO_3H$ in a 4.5% by weight solution of acetic acid in water, from DuPont;
Surfactant no. 19=ammonium salt of perfluoro-octanoic acid from 3M Binder According to a sixth embodiment of the layer configuration, according to the present invention, the layer configuration further contains a binder.

Crosslinking Agent

According to a seventh embodiment of the layer configuration, according to the present invention, the layer configuration further contains a cross-linking agent.

Electroluminescent Phosphors

According to an eighth embodiment of the layer configuration, according to the present invention, the layer configuration further comprises a layer of an electroluminescent phosphor.

According to a ninth embodiment of the layer configuration, according to the present invention, the layer configuration further comprises a layer of an electroluminescent phosphor, wherein the electroluminescent phosphor belongs to the class of II–VI semiconductors e.g. ZnS, or is a combination of group II elements with oxidic anions, the most common being silicates, phosphates, carbonates, germanates, stannates, borates, vanadates, tungstates and oxysulphates. Typical dopants are metals and all the rare earths e.g. Cu, Ag, Mn, Eu, Sm, Tb and Ce.

According to a tenth embodiment of the layer configuration, according to the present invention, the layer configuration further comprises a layer of an electroluminescent phosphor, wherein the electroluminescent phosphor is encapsulated with a transparent barrier layer against moisture e.g. $Al_2O_3$ and AlN. Such phosphors are available-from Sylvania, Shinetsu polymer KK, Durel, Acheson and Toshiba. An example of coatings with such phosphors is 72X, available from Sylvania/GTE, and coatings disclosed in U.S. Pat. No. 4,855,189.

According to an eleventh embodiment of the layer configuration, according to the present invention, the layer configuration further comprises a layer of an electroluminescent phosphor, wherein the electroluminescent phosphor is ZnS doped with manganese, copper or terbium or $CaGa_2S_4$ doped with cerium, e.g. the electroluminescent phosphor pastes supplied by DuPont: LUXPRINT™ type 7138J, a white phosphor; LUXPRINT™ type 7151J, a-green-blue phosphor; and LUXPRINT™ type 7174J, a yellow-green phosphor; and ELECTRODAG™ EL-035A supplied by Acheson.

According to a twelfth embodiment of the layer configuration, according to the present invention, the layer configuration further comprises a layer of an electroluminescent phosphor, wherein the electroluminescent phosphor is a zinc sulphide phosphor doped with manganese and encapsulated with AlN.

Dielectric Layer

According to a thirteenth embodiment of the layer configuration, according to the present invention, the layer configuration further comprises a dielectric layer.

Any dielectric material may be used in the dielectric layer, with yttria and barium titanate being preferred e.g. the barium titanate paste LUXPRINT™ type 7153E high K dielectric insulator supplied by DuPont and the barium titanate paste ELECTRODAG™ EL-040 supplied by Acheson. A positive ion exchanger may be incorporated into the dielectric layer to capture any ions dissolving escaping from the phosphor of the light-emitting layer. The amount of ion exchanger in the dielectric layer has to be optimized so that it has a maximum effectiveness in reducing black spots while not reducing the initial brightness level. It is therefore preferred to add 0.5 to 50 parts by weight of ion exchanger to 100 parts by weight of the total amount of resin and dielectric material in the dielectric layer. The ion exchanger may be organic or inorganic.

Suitable inorganic ion exchangers are hydrated antimony pentoxide powder, titanium phosphate, salts of phosphoric acid and silicic acid and zeolite.

Support

According to a fourteenth embodiment of the layer configuration, according to the present invention, the support is transparent or translucent.

According to a fifteenth embodiment of the layer configuration, according to the present invention, the support is a polymeric film, silicon, a ceramic, an oxide, glass, polymeric film reinforced glass, a glass/plastic laminate, a metal/plastic laminate, optionally treated paper and laminated paper.

According to a sixteenth embodiment of the layer configuration, according to the present invention, the support is provided with a subbing layer or other adhesion promoting means to aid adhesion to the substantially transparent layer configuration.

According to a seventeenth embodiment of the layer configuration, according to the present invention, the support is a transparent or translucent polymer film.

A transparent or translucent support suitable for use with the electroconductive or antistatic layers, according to the present invention, may be rigid or flexible and consist of a glass, a glass-polymer laminate, a polymer laminate, a thermoplastic polymer or a duroplastic polymer. Examples of thin flexible supports are those made of a cellulose ester, cellulose triacetate, polypropylene, polycarbonate or polyester, with poly(ethylene terephthalate), poly(ethylene naphthalene-1,4-dicarboxylate), polystyrene, polyethersulphone, polycarbonate, polyacrylate, polyamide, polyimides, cellulose triacetate, polyolefins and poly(vinyl chloride), optionally treated by corona discharge or glow discharge or provided with a subbing layer.

Electroluminescent Devices

Aspects of the present invention are realized by an electroluminescent device comprising a layer configuration prepared according to the process, according to the present invention.

According to an eighteenth embodiment of the layer configuration, according to the present invention, the layer configuration is an electroluminescent device.

According to a nineteenth embodiment of the layer configuration, according to the present invention, the layer configuration is a light emitting diode.

Thin film electroluminescent devices (ELDs) are all characterized by one (or more) electroluminescent active layer(s) sandwiched between two electrodes. Optionally a dielectric layer may also be part of the sandwich.

Thin film ELDs can be subdivided into organic and inorganic based ELDs. Organic-based thin film ELDs can be subdivided into low molecular weight organic devices including oligomers (Organic Light Emitting Diodes (OLEDs)) and high molecular weight organic devices (Polymer Light Emitting Diodes (PLEDs). The inorganic ELDs on the other hand can be further subdivided into the High Voltage Alternating Current (HV-AC) ELDs and the Low Voltage Direct Current (LV-DC) ELDs. The LV-DC ELDs include Powder ELDs (DC-PEL Devices or DC-PELDs) and thin film DC-ELDs, hereinafter called Inorganic Light Emitting Diodes (ILEDs).

The basic construction of organic ELDs (PLED and OLED) comprises following layer arrangement: a transparent substrate (glass or flexible plastic), a transparent conductor, e.g. Indium Tin Oxide (ITO), a hole transporting layer, a luminescent layer, and a second electrode, e.g. a Ca, Mg/Ag or Al/Li electrode. For OLEDs the hole transporting and luminescent layers are 10–50 nm thick and applied by vacuum deposition, whereas for PLEDs the hole transporting layer is usually about 40 nm thick and the luminescent layer is usually about 100 nm thick and applied by spin coating or other non-vacuum coating techniques. A direct voltage of 5–10 V is applied between the electrodes and light emission results from holes and electrons being injected from the positive and negative electrodes respectively combining in the luminescent layer thereby producing the energy to excite the luminescent species to emit light.

In OLEDs the hole transporting layer and electroluminescent layer consist of low molecular organic compounds e.g. N,N'-diphenyl-1,1'-biphenyl-4,4'-diamine can be used as the hole transporter and aluminium (III) 8-hydroxyquinoline complex, polyaromatics (anthracene, perylene and stilbene derivatives) and polyheteroaromatics (oxazoles, oxadiazoles, thiazoles etc.) can be used as electroluminescent compounds. In PLEDs electroluminescent compounds that can be used are polymers like the non-conjugated poly(N-vinylcarbazole) derivatives (PVK) or conjugated polymers like poly(p-phenylene vinylenes) (PPV), polyfluorenes, poly (3-alkylthiophene) and poly(p-phenylene ethynylenes).

Low voltage DC PEL Devices generally comprise a transparent substrate, a transparent conductor (ITO), a doped ZnS phosphor layer (20 μm), and a top electrode of evaporated aluminium. The phosphor layer is applied by means of the doctor blade technique or screen printing on an ITO conducting layer. Then an aluminium electrode is applied by evaporation. Upon applying a direct current voltage of several volts (ITO positive), holes start moving towards the aluminium electrode, thereby creating an insulating region (about 1 μm in thickness) next to the ITO layer within one minute or so. This results in a current drop which is associated with the onset of light emission. This process has been called the forming process. In the thin high resistive phosphor layer thereby formed, high electric fields occur and electroluminescence is already possible at low voltages (typically between 10 and 30 V).

In hybrid LEDs, inorganic emitting so-called quantum dots are used in combination with organic polymers with charge transporting properties and in some cases also emitting properties. Hybrid LEDs with CdSe nano-particles have been reported by Colvin et al. [see Nature, volume 370, pages 354–357, (1994)], Dabbousi et al. [see Appl. Phys. Lett., volume 66, pages 1316–1318 (1995), and Gao et al. [see J. Phys. Chem. B, volume 102, pages 4096–4103 (1998)], herein incorporated by reference.

Light emitting devices with ZnS:Cu nano-crystals and a non-semiconducting polymer have been reported by Huang et al. [see Appl. Phys. Lett., volume 70, pages 2335–2337 (1997)] and Que et al. [see Appl. Phys. Lett., volume 73, pages 2727–2729 (1998), herein incorporated by reference, with turn on voltages below 5 V.

Photovoltaic Devices

Aspects of the present invention are realized by a photovoltaic device comprising a layer configuration prepared according to the process, according to the present invention.

According to a twentieth embodiment of the layer configuration, according to the present invention, the layer configuration is a photovoltaic device.

According to a twenty-first embodiment of the layer configuration, according to the present invention, the layer configuration further comprises at least one photovoltaic layer. The photovoltaic layer may be organic layer, a hybrid inorganic and organic layer or an inorganic layer.

According to a twenty-second embodiment of the layer configuration, according to the present invention, the layer configuration is a solar cell.

Photovoltaic devices incorporating the layer configuration, according to the present invention, can be of two types: the regenerative type which converts light into electrical power leaving no net chemical change behind in which current-carrying electrons are transported to the anode and the external circuit and the holes are transported to the cathode where they are oxidized by the electrons from the external circuit and the photosynthetic type in which there are two redox systems one reacting with the holes at the surface of the semiconductor electrode and one reacting with the electrons entering the counter-electrode, for example, water is oxidized to oxygen at the semiconductor photoanode and reduced to hydrogen at the cathode. In the case of the regenerative type of photovoltaic cell, as exemplified by the Graetzel cell, the electron transporting medium may be a nano-porous metal oxide semiconductor with a band-gap of greater than 2.9 eV, such as titanium dioxide, niobium(V) oxide, tantalum(V) oxide and zinc oxide, the hole transporting medium may be a liquid electrolyte supporting a redox reaction, a gel electrolyte supporting a redox reaction, an organic hole transporting material, which may be a low molecular weight material such as 2,2',7,7'-tetrakis(N,N-di-p-methoxyphenyl-amine)9,9'-spirobifluorene (OMeTAD) or triphenylamine compounds or a polymer such as PPV-derivatives, poly(N-vinylcarbazole) etc., or inorganic semiconductors such as CuI, CuSCN etc. The charge transporting process can be ionic as in the case of a liquid electrolyte or gel electrolyte or electronic as in the case of organic or inorganic hole transporting materials.

Such regenerative photovoltaic devices can have a variety of internal structures in conformity with the end use. Conceivable forms are roughly divided into two types: structures which receive light from both sides and those which receive light from one side. An example of the former is a structure made up of a transparently conductive layer e.g. an ITO-layer or a PEDOT/PSS-containing layer and a transparent counter electrode electrically conductive layer e.g. an ITO-layer or a PEDOT/PSS-containing layer having interposed therebetween a photosensitive layer and a charge transporting layer. Such devices preferably have their sides sealed with a polymer, an adhesive or other means to prevent deterioration or volatilization of the inside substances. The external circuit connected to the electrically-conductive substrate and the counter electrode via the respective leads is well-known.

Alternatively the spectrally sensitized nano-porous metal oxide, according to the present invention, can be incorporated in hybrid photovoltaic compositions such as described in 1991 by Graetzel et al. in Nature, volume 353, pages 737–740, in 1998 by U. Bach et al. [see Nature, volume 395, pages 583–585 (1998)] and in 2002 by W. U. Huynh et al. [see Science, volume 295, pages 2425–2427 (2002)]. In all these cases, at least one of the components (light absorber, electron transporter or hole transporter) is inorganic (e.g. nano-$TiO_2$ as electron transporter, CdSe as light absorber and electron transporter) and at least one of the components is organic (e.g. triphenylamine as hole transporter or poly(3-hexylthiophene) as hole transporter).

Transistors

Aspects of the present invention are realized by a transistor comprising a layer configuration prepared according to the process, according to the present invention.

According to a twenty-third embodiment of the layer configuration, according to the present invention, the layer configuration further comprises a layer with one or more of the electron transporting or hole transporting components described above, but within such a configuration that it can be used as a transistor. The semiconductor can be n-type, p-type or both (ambipolar transistor) and can be either organic or inorganic.

INDUSTRIAL APPLICATION

Layer configurations comprising at least a first layer comprising an intrinsically conductive polymer and a second layer consisting of a non-continuous layer of conductive silver can be used in a wide range of electronic devices such as photovoltaic devices, solar cells, batteries, capacitors, light emitting diodes, organic and inorganic electroluminescent devices, smart windows, electrochromic devices, sensors for organic and bio-organic materials and field effect transistors [see also chapter 10 of the Handbook of Oligo- and Polythiophenes, Edited by D. Fichou, Wiley-VCH, Weinheim (1999)].

The invention is illustrated hereinafter by way of EXAMPLES. The percentages and ratios given in these examples are by weight unless otherwise indicated.

Ingredients used in the comparative experiments of EXAMPLE 2:

| Structural formula | | |
|---|---|---|
| STAB01 | (1-phenyl-5-mercapto-tetrazole structure) | 1-phenyl-5-mercapto-tetrazole |
| STAB02 | | sodium tartrate |
| STAB03 | | thiourea |
| STAB04 | $Na_2S$ | sodium sulphide |
| STAB05 | (5-methyl-s-triazolo[1,5-a]pyrimidin-7-ol structure) | 5-methyl-s-triazolo[1,5-a]pyrimidin-7-ol |
| STAB06 | ($H_{15}C_7$ substituted oxadiazole-SH) | |
| STAB07 | ($(C_4H_9)$, $(H_9C_4)$ substituted tetrazole-SH) | |
| STAB08 | (tetrazole-SH $Na^+$ structure) | |
| STAB09 | (triazole-SH with $(CH_2)_2$-N structure) | |

EXAMPLE 1

Conductive Ag-Pattern Made by Development of a Silver Halide Emulsion with an Outermost PEDOT/PSS Layer Preparation of the Photographic Emulsion Layer:

A photographic AgCl(63.29%)Br(36.31%)I(0.40%) emulsion in gelatine was prepared using the double jet precipitation technique. The average silver halide particle size was 300 nm. After the precipitation step the emulsion was washed and different amounts of gelatine were added to yield the gelatine to $AgNO_3$ (g/g) ratio's listed in Table 1. This emulsion was chemically ripened and was spectrally sensitized to render the emulsion sensitive to He/Ne laser exposure. The emulsion was coated on a subbed 100 μm thick polyethylene terephthalate support to a coverage equivalent to 5 g $AgNO_3$ per square meter. This is photographic material A.

Surface Resistance Measurements:

The surface resistance measurements were carried out as follows: the layer electrode configurations were cut into strips 3.5 cm in width to ensure perfect positioning of the electrode material; parallel copper electrodes each 35 mm long, 3 mm wide and 35 mm apart, capable of forming line contacts and mounted on a TEFLON™ insulator were brought into contact with the outermost conductive layer of the strip giving a contacting area of 3.5×3.5 $cm^2$, a constant contact force being ensured by placing a 4 kg weight on the TEFLON™ mounting; and the surface resistance was then directly measured using a Fluke-77 III Multimeter.

The surface resistances determined for different gelatine to $AgNO_3$ ratios after full area exposure with an AGFA-GEVAERT™ AVANTRA recorder and subsequent development in the AGFA-GEVAERT™ IPDplus developer, fixed in an AGFA-GEVAERT™ G333 fixer and finally rinsed in water are given in Table 1.

TABLE 1

| Material | Gelatine/$AgNO_3$ (g/g) | Surface resistance [Ω/square] |
|---|---|---|
| A1 | 0.40 | >$10^7$ |
| A2 | 0.30 | 60 |
| A3 | 0.20 | 20 |
| A4 | 0.18 | 15 |
| A5 | 0.14 | 10 |

Table 1 shows that the lower the gelatine content the lower the surface resistance. This can be explained by developed silver particles touching each other at low gelatine contents and hence creating a conductive path. Material A5 yields the highest surface conductance, but for convenience reasons, material A4 was used in the further examples.

Preparation of the PEDOT/PSS Dispersion:

EP-A 686662 (U.S. Pat. No. 5,766,515) discloses in the example the preparation of a 1.2% PEDOT/PSS dispersion in water. 15 mL of a 2% solution of ZONYL™ FSO100 in water, 1.25 g of Z6040, a silane from DOW CORNING and 25 g of diethyleneglycol were added to 106 g of this dispersion to give the PEDOT/PSS dispersion used in the following EXAMPLES.

Preparation of Double Layer Electrode Configuration of Material B:

The unexposed Material A4 was coated with the PEDOT/PSS dispersion to a wet thickness of 50 μm and then dried for 20 minutes at 120° C. The surface resistivity of the PEDOT/PSS layer was about 500 Ω/square. The resulting layer configuration was then exposed with the AGFA-GEVAERT™ AVANTRA recorder with the patterns shown in FIG. 1 and developed as described above.

Preparation of Double Layer Electrode Configuration of Material C:

The PEDOT/PSS-dispersion was coated on the processed material A4 to a wet thickness of 50 μm and then dried for 20 minutes at 120° C., thereby producing Material C. The surface resistance of the PEDOT/PSS layer was about 500 Ω/square in the non-exposed regions material A4.

Evaluation of Materials A4 (Exposed and Developed), B and C:

The surface resistances determined as described above are given in Table 2 for the double layer electrode configurations with a developed silver pattern coated with a PEDOT/PSS outermost layer of Materials B and C, together with that for the exposed and developed Material A4 without an PEDOT/PSS outermost layer as a control material.

The optical density of the layer configurations were determined in transmission using a MacBeth™ TD924 densitometer with a visible filter for layer configurations without photographic treatment, in pattern type (d) in which no silver was developed and in pattern (a) in which silver was developed over the whole 3 cm×3 cm area without deducting the density of the support. These measurements were then used to calculate the overall optical density for patterns (b) and (c). The optical density results are also given in Table 2.

From Table 2 it can be concluded that (1) it is possible to expose the PEDOT/PSS layer to the IPDplus developer and G333 fixer with only minor losses in surface conductivity and (2) the Ag-lines increase the "apparent" surface conductivity. Due to the measurement set-up, only the PEDOT/PSS is contacted (top-layer). From the high surface conductivity values, the PEDOT/PSS-Ag contact appears to be Ohmic in nature.

If the PEDOT/PSS coating is applied before the exposure and development, it functions as a protective coating and therefore material B is in most cases preferred over material C, because this allows for automatic handling (exposure and development) without any danger of damaging the material.

TABLE 2

| | Description | Pattern used from FIG. 1 type | Pattern used from FIG. 1 description | transmission O.D. | Surface resistance [Ω/square] |
|---|---|---|---|---|---|
| Control material | | | | | |
| A4 | Without any photographic treatment | — | — | — | >2 × 10$^7$ |
| A4 | After exposure and development | a | Solid area | 3.70 | 15 |
| A4 | After exposure and development | b | 1 mm lines, 10 mm spacing | 0.35* | 100 |
| A4 | After exposure and development | c | 150 μm lines, 5 mm spacing | 0.13* | 340 |
| A4 | After exposure and development | d | No Ag developed | 0.03 | >2 × 10$^7$ |
| Invention material | | | | | |
| B | Without any photographic treatment | — | — | — | 450 |
| B | After exposure and development | a | Solid area | 3.90 | 13 |
| B | After exposure and development | b | 1 mm lines, 10 mm spacing | 0.48* | 150 |
| B | After exposure and development | c | 150 μm lines, 5 mm spacing | 0.25* | 360 |
| B | After exposure and development | d | No Ag developed | 0.15 | 470 |
| C | Without any photographic treatment | — | — | — | 500 |
| C | After exposure and development | a | Solid area | 3.80 | 14 |
| C | After exposure and development | b | 1 mm lines, 10 mm spacing | 0.45* | 108 |
| C | After exposure and development | c | 150 μm lines, 5 mm spacing | 0.22* | 360 |
| C | After exposure and development | d | No Ag developed | 0.11 | 720 |

*calculated value

EXAMPLE 2

Conductive Ag-Pattern Made by DTR with Conductive PEDOT/PSS on Top

Preparation of the Control Material, Material D:

The preparation of the physical development nuclei (PdS) is described in the example of EP-A 0769 723. From this example solutions A1, B1 and C1 were used to prepare the nuclei. To 1000 mL of this PdS dispersion 10 g of a 10 g/L water solution of Aerosol™ OT from American Cyanamid and 5 g of a 50 g/L solution of perfluorcaprylamide-polyglycol were added. This dispersion was then coated to a wet layer thickness of 13.5 μm on a poly(ethylene terephthalate) support with a 4 μm thick gelatine subbing layer and then dried for 60 minutes at 25° C. This is material D.

Preparation of Material E:

The above-described PEDOT/PSS dispersion was used to coat material D to a wet thickness of 40 μm and was then dried for 15 minutes at 100° C., thereby producing material E.

Preparation of the Transfer Emulsion Layer:

The preparation of the silver chlorobromide emulsion and the preparation of the transfer emulsion layer was as disclosed in EP-A 769 723 except that the coverage of silver halide applied was equivalent to 1.25 g/m$^2$ of AgNO$_3$ instead of 2 g/m$^2$ thereof.

Exposure and Development of Materials D and E:

The transfer emulsion layer was exposed image-wise as shown in FIG. 1 and processed in contact with the receiver (Material D and material E) at 25° C. for 10 s with a AGFA-GEVAERT™ CP297 developer solution.

Preparation of the Double Layer Electrode Configuration:

Processed material D was coated with the above-described PEDOT/PSS-dispersion to a wet-layer thickness of 50 μm and then dried for 20 minutes at 120° C. The surface resistivity of the PEDOT/PSS layer was about 500 Ohm/Sq in the non-exposed areas of material D. Material F was thereby prepared.

Evaluation of Materials D, E and F:

The surface resistances and optical densities (complete material) after exposure and development according to the patterns shown in FIG. 1 are given in Table 3.

conductivity values, the PEDOT/PSS-Ag contact appears to be Ohmic in nature. If the PEDOT/PSS coating is applied before the exposure and development, it functions as a protective coating and therefore material E is in most cases preferred over material F, because this allows for automatic handling (exposure and development) without any danger of damaging the material.

Improving of the Surface Conductance of the Ag°-Image by Etching in Presence of Halide Ions Followed by a Chemical Development Due to the fact that the DTR process is a physical development, the resulting Ag°-particles are smooth and rounded. Chemical development, which is more explosive, results in a higher degree of particle overlap and particle touching and hence will result in patterns with higher conductivity. However, this type of development does not take place in a DTR process. In order to improve the surface conductance of a Ag°-image obtained by the DTR-process, the conductive Ag°-pattern obtained by the DTR process was further processed by first treating it with an etching solution containing an oxidizer and halide ions (thereby partially oxidizing the Ag° to Ag$^+$ which is present as AgCl,

TABLE 3

|  | Description | Pattern used from FIG. 1 | | transmission O.D. | Surface resistance [Ω/square] |
| --- | --- | --- | --- | --- | --- |
|  |  | type | description |  |  |
| Control material |  |  |  |  |  |
| D | Without any photographic treatment | — | — | 0.04 | >2 × 10$^7$ |
| D | After transfer reaction | a | Solid area | 2.50 | 2.1 |
| D | After transfer reaction | b | 1 mm lines, 10 mm spacing | 0.35* | 16 |
| D | After transfer reaction | c | 150 μm lines, 5 mm spacing | 0.20* | 109 |
| D | After transfer reaction | d | No Ag developed | 0.04 | >2 × 10$^7$ |
| Invention material |  |  |  |  |  |
| E | Without any photographic treatment | — | — | 0.09 | 500 |
| E | After transfer reaction | a | Solid area | 2.30 | 5.2 |
| E | After transfer reaction | b | 1 mm lines, 10 mm spacing | 0.33* | 37 |
| E | After transfer reaction | c | 150 μm lines, 5 mm spacing | 0.19* | 165 |
| E | After transfer reaction | d | No Ag developed | 0.07 | 800 |
| F | Without any photographic treatment | — | — | 0.10 | 650 |
| F | After transfer reaction | a | Solid area | 2.50 | 2.3 |
| F | After transfer reaction | b | 1 mm lines, 10 mm spacing | 0.35* | 18 |
| F | After transfer reaction | c | 150 μm lines, 5 mm spacing | 0.20* | 120 |
| F | After transfer reaction | d | No Ag developed | 0.09 | 750 |

*calculated values

From Table 3 it can be concluded that it is possible to (1) transfer Ag-salts trough the PEDOT/PSS layer, (2) expose the PEDOT/PSS layer to the AGFA-GEVAERT™ CP297 developer with only a minor loss in surface conductivity without affecting the optical transparency and (3) the Ag-lines increase the "apparent" surface conductivity significantly.

Only the outermost PEDOT/PSS layer is contacted in the surface resistance measurements. From the high surface AgBr or AgBrCl depending upon the halides used), then developing with a Graphic developer which brought about explosive or chemical development of the newly formed silver halide crystals and finally fixing and washing. When this process was applied to freshly produced processed material D with pattern "a" using AGFA-GEVAERT™ IPDplus developer and AGFA-GEVAERT™ G333 fixer an up to 18% decrease in surface resistance (=18% increase in surface conductance) was realized. The etching bath compositions and etching times are given in Table 4.

TABLE 4

| Bath nr | Bath composition | | | | Etching time (s) |
|---|---|---|---|---|---|
| | $KMnO_4$ [g/L] | $K_4Fe(CN)_6$ [g/L] | KCl [g/L] | KBr [g/L] | |
| 1 | — | 1 | — | 10 | 30 |
| 2 | — | 1 | 10 | — | 30 |
| 3 | — | 0.1 | — | 10 | 30 |
| 4 | — | 0.1 | 10 | — | 30 |
| 5 | 0.01 | — | — | 10 | 30 |
| 6 | 0.01 | — | 10 | — | 30 |
| 7 | 0.005 | — | — | 10 | 30 |
| 8 | 0.005 | — | 10 | — | 30 |
| 9 | 0.01 | — | 5 | — | 120 |
| 10 | 0.01 | — | 10 | — | 120 |
| 11 | 0.01 | — | 25 | — | 120 |
| 12 | 0.01 | — | — | 5 | 30 |
| 13 | 0.01 | — | — | 10 | 30 |
| 14 | 0.01 | — | — | 25 | 30 |
| 15 | 0.01 | — | 2.5 | 2.5 | 30 |
| 16 | 0.01 | — | 5 | 5 | 30 |
| 17 | 0.01 | — | 10 | 10 | 30 |
| 18 | 0.01 | — | 2.5 | 2.5 | 60 |
| 19 | 0.01 | — | 5 | 5 | 60 |
| 20 | 0.01 | — | 10 | 10 | 60 |
| 21 | 0.01 | — | 2.5 | 2.5 | 120 |
| 22 | 0.01 | — | 5 | 5 | 120 |
| 23 | 0.01 | — | 10 | 10 | 120 |

The optical density was measured with a MacBeth™ densitometer TD904 with a visible filter. The surface resistances and optical densities obtained are given in Table 5.

From Table 5 it is clear that the kind and amount of oxidising agent used is very important: an oxidising agent which is too strong or too concentrated will destroy the conductive pattern too rapidly. If the oxidising agent is too weak or too dilute, almost nothing will happen. Also the amount and kind of halide ions is important as can be seen from Table 5.

TABLE 5

| Bath nr | $D_{max}$ | | Surface resistance [Ω/square] | | |
|---|---|---|---|---|---|
| | before etching | etching after + development | before etching | after etching + development | % change |
| 1 | 2.84 | 2.75 | 3.7 | 3.5 | −7 |
| 2 | 2.90 | 2.88 | 2.7 | 2.9 | +5 |
| 3 | 2.92 | 2.87 | 2.7 | 3.0 | +10 |
| 4 | 3.00 | 2.89 | 3.0 | 2.9 | −5 |
| 5 | 2.48 | 2.27 | 2.5 | 6.4 | +156 |
| 6 | 2.69 | 2.61 | 2.5 | 2.4 | −4 |
| 7 | 2.52 | 2.65 | 2.5 | 2.7 | +8 |
| 8 | 2.76 | 2.52 | 2.5 | 2.3 | −8 |
| 9 | 2.49 | 2.36 | 2.7 | 2.7 | 0 |
| 10 | 2.50 | 2.38 | 3.0 | 2.6 | −13 |
| 11 | 2.48 | 2.44 | 2.8 | 2.8 | 0 |
| 12 | 2.84 | 2.80 | 2.6 | 2.4 | −8 |
| 13 | 2.72 | 2.63 | 3.2 | 3.3 | +3 |
| 14 | 2.55 | 2.48 | 2.3 | 2.3 | 0 |
| 15 | 2.45 | 2.31 | 3.4 | 3.0 | −12 |
| 16 | 2.47 | 2.36 | 3.1 | 2.8 | −10 |
| 17 | 2.46 | 2.23 | 3.3 | 3.0 | −9 |
| 18 | 2.50 | 2.33 | 3.3 | 3.0 | −9 |
| 19 | 2.38 | 2.23 | 3.2 | 2.8 | −13 |
| 20 | 2.48 | 2.32 | 3.4 | 2.8 | −18 |
| 21 | 2.47 | 2.33 | 3.3 | 3.0 | −9 |
| 22 | 2.52 | 2.37 | 3.2 | 2.8 | −13 |
| 23 | 2.48 | 2.35 | 3.2 | 2.7 | −16 |

Recovery of the PEDOT/PSS Conductivity After IPDplus Processing by Means of Re-Oxidizing the PEDOT/PSS Layer The surface resistance of the outermost PEDOT/PSS-layer in Material B was not substantially increased upon 30 s contact with the AGFA-GEVAERT™ IPDplus developer, but the surface resistance of the PEDOT/PSS-layer of the AGFA-GEVAERT™ ORGACON film increased from 500 Ω/square to ~3000 Ω/square upon 30 s contact therewith. It has been found, however, that the original surface resistance can be largely recovered by treatment with solutions of particular oxidizing agents for 30 s at 25° C. The compositions of the solutions of oxidizing agent used and the surface resistances results obtained before contact with the IPDplus developer, after contact with the IPDplus developer and after subsequent contact with the particular oxidizing solution are given in Table 6.

TABLE 6

| | Surface resistance [Ω/square] | | |
|---|---|---|---|
| solution of oxidising agent in water (% by weight) | before processing in IPDplus (35° C. & 30 s) | after processing in IPDplus (35° C. & 30 s) | after processing in oxidising agent solution |
| $FeCl_3$ (0.1%) | 503 | 3270 | 1608 |
| $FeCl_3$ (2%) | 452 | 3015 | 1440 |
| $H_2O_2$ (2%) | 466 | 3450 | 2963 |
| $H_2O_2$ (10%) | 485 | 3270 | 2238 |
| $K_3Fe(CN)_6$ (0.1%) | 459 | 3075 | 1722 |
| $K_3Fe(CN)_6$ (2%) | 549 | 3600 | 1607 |
| Dimethylsulfoxide (0.1%) | 513 | 2385 | 1793 |
| $HNO_3$ (0.1%) | 449 | 2160 | 1299 |
| $Na_2S_2O_8$ (2%) | 432 | 2130 | 1400 |
| Succinic acid (0.1%) | 440 | 2400 | 1781 |
| Succinic acid (2%) | 543 | 2835 | 1514 |

The best results were realized with aqueous solutions of $Na_2S_2O_8$ and $FeCl_3$ with which the surface resistance after contact with the IPDplus developer decreased by a factor of 2 to ~1500 Ω/square, but this was still a factor of 3 above the surface resistance of the ORGACON film prior to contact with IPDplus developer.

EXAMPLE 3

Conductive Ag-Pattern Made by Diffusion Transfer Reaction with Patterned Conductive PEDOT/PSS on Top Sometimes it is necessarily to have a patterned transparent conductive layer on top of a high conductive metallic pattern (e.g. EXAMPLE 5). This can be done by applying patterned the PEDOT/PSS on top of the emulsion layer (as described in example 1) prior to exposure and development or applying patterned PEDOT/PSS on top of the nuclei layer (as described in example 2) prior to the diffusion transfer process. Analogously, as was described in examples 1 and 2 (comparison), the patterned PEDOT/PSS can also be applied after the formation of the Ag-pattern. The patterning of the PEDOT/PSS can be subtractive by destroying its conductivity (e.g. EP-A 1054414, EP-A 1079397) or additive by using printing techniques like flexographic printing, screen printing, tampon printing, off set printing and ink jet printing.

Preparation of the Control Material, Material G:

To 1000 mL of the above described PdS dispersion 10 mL of a 50 g/L in water solution of Antarox CO630 from GAF was added. This dispersion was then coated to a wet-layer thickness of 13.5 μm on a PET substrate with a 2 μm thick gelatine subbing layer and was then dried for 60 minutes at 25° C. to give Material G.

Preparation of the Screen Print Paste of PEDOT/PSS:

The screen print paste was prepared by adding 3.47 kg of 1,2-propandiol and 0.38 kg of diethylene glycol to 2.56 kg of a 1.2% by weight dispersion of PEDOT/PSS with a weight ratio of PEDOT to PSS of 1:2.4 in a reactor, then distilling off 1.5 L of water by heating with an oil bath at 62° C. under stirring at a vacuum which varied between 31 and 55 mbar over a period of 234 minutes, cooling the resulting mixture to 20° C. and then distilling off a further 0.49 L of water by heating with an oil bath at 60.5° C. with stirring at a vacuum which varied between 24 and 26 mbar over a period of 287 minutes. The water content in the 3.8 kg of paste produced, as determined by the Karl Fischer method, was 3.9% by weight.

To 297 g of the obtained paste 1.5 g of 2-glycidoxypropyl-trimethoxysilane, 0.75 g of ZONYL™ FSO (ZONYL™ FSO is a 50% by wt solution of ZONYL™ FSO100 a mixture of 50% by wt of water and 50% by wt of ethylene glycol) and 0.75 g of silicone antifoam agent X50860A was added to give a screen printing paste.

Preparation of Material H:

The screen printing paste was silk screen printed with a manual press and a P120 screen onto material G to cover the final images shown in FIG. 1 thereby giving Material H.

Exposure and Development of Materials G and H:

The transfer emulsion layer was exposed image-wise as shown in FIG. 1 and processed in contact with the receiver (Material G and Material H) at 25° C. for 10 s with an AGFA-GEVAERT™ CP297 developer solution.

Preparation of Double Layer Electrode Configuration of Material I:

The screen printing paste was silk screen printed with a manual press and a P120 screen onto the processed material G so as to cover the image as shown in FIG. 1, thereby producing Material I.

Evaluation of Materials G, H and I:

The surface resistances and optical densities (complete material) after exposure and development according to the pattern of FIG. 1 are given in Table 7.

TABLE 7

| | Description | Pattern used from FIG. 1 type | Pattern used from FIG. 1 description | transmission O.D. | Surface resistance [Ω/square] |
|---|---|---|---|---|---|
| Control material | | | | | |
| G | Without any photographic treatment | — | — | 0.03 | >2 × 10$^7$ |
| G | After transfer reaction | a | Solid area | 2.35 | 2.2 |
| G | After transfer reaction | b | 1 mm lines, 10 mm spacing | 0.24* | 18 |
| G | After transfer reaction | c | 150 μm lines, 5 mm spacing | 0.10* | 140 |
| G | After transfer reaction | d | no Ag developed | 0.03 | >2 × 10$^7$ |
| Invention material | | | | | |
| H | Without photographic treatment | — | — | 0.10 | 1500 |
| H | After transfer reaction | a | Solid area | 2.10 | 8.5 |
| H | After transfer reaction | b | 1 mm lines, 10 mm spacing | 0.28* | 225 |
| H | After transfer reaction | c | 150 μm lines, 5 mm spacing | 0.16* | 2200 |
| H | After transfer reaction | d | No Ag developed | 0.12 | 18000 |
| I | Without any photographic treatment | — | — | 0.13 | 1250 |
| I | After transfer reaction | a | Solid area | 2.38 | 4.4 |
| I | After transfer reaction | b | 1 mm lines, 10 mm spacing | 0.35* | 30 |
| I | After transfer reaction | c | 150 μm lines, 5 mm spacing | 0.20* | 100 |
| I | After transfer reaction | d | No Ag developed | 0.09 | 1250 |

*calculated values

The results in Table 7 show that it is feasible to construct a double layer electrode by this method, although the surface resistance of the PEDOT/PSS screen print paste was adversely affected by the AGFA-GEVAERT™ CP297 developing solution, the surface resistance increasing from 1500 Ω/square to 18000 Ω/square.

EXAMPLE 4

Conductive PEDOT/PSS with Conductive Ag-Pattern Made by Diffusion Transfer Reaction on Top Preparation of the Control Material, Material J:

The above-described PEDOT/PSS dispersion was used to coat a polyethylene terephthalate support with a 4 μm gelatine subbing layer to a wet thickness of 40 μm and was then dried for 15 minutes at 100° C., thereby producing material J.

Preparation of Material K:

To 1000 mL of the above described PdS dispersion 10 g of a 10 g/L water solution of Aerosol OT from American Cyanamid and 5 g of a 50 g/L solution of perfluorcaprylamidpolyglycol were added. This dispersion was then coated with a wet layer thickness of 13.5 μm on material J and then dried for 60 minutes at 25° C. This is material K.

Exposure and Development of Material K:

The transfer emulsion layer was exposed image-wise as shown in FIG. 1 and processed in contact with the receiver (Material K) at 25° C. for 10 s with the AGFA-GEVAERT™ CP297 developer solution. The surface resistances and optical densities (complete material) after exposure and development according to the pattern of FIG. 1 are given in Table 8.

Table 8 demonstrates the feasibility of a double layer electrode configuration with a Ag-conductive pattern on top of a conductive PEDOT/PSS-layer. The measured value of surface resistivity of the untreated material K is 5000 Ω/square instead of 500 Ω/square. It is also not >20 MΩ/square. This indicates a slight mixing of the layers and/or inhomogeneities in the PdS-layer. It is clear from the above description that the nuclei layer can also be applied in a patterned way.

C=a palladium sulfide nucleation layer
D=a conductive silver pattern
E=a highly conductive PEDOT/PSS-layer
F=a shunt resistance hindering layer
G=a photovoltaic blend
H=a lithium fluoride/aluminium electrode In step 1 in which the subbed surface of a subbed poly(ethylene terephthalate) film A [the subbing layer represented by hatching] is coated with a gelatin layer B; step 2 in which a palladium sulfide nucleation layer C is applied to the gelatin layer B; step 3 in which a diffusion transfer process is carried out in which a conductive silver pattern D is produced; step 4 in which the conductive silver pattern D is coated with a highly conductive PEDOT/PSS-layer E by e.g. screen printing, and optionally additionally with a shunt resistance hindering layer F, e.g. a PEDOT/PSS layer or a PEDOT-S/polycationic or polyanionic polymer with a higher surface resistance; step 5 in which layer E or F is coated with a photovoltaic blend, e.g. a blend of MDMO-PPV/PCBM G, by e.g. curtain coating, spincoating or screen printing; and step 6 in which layer G is coated with a non-continuous lithium fluoride/aluminium layer forming a top electrode H.

This figure shows a way of using the multilayer configuration in the construction of a thin film solar cell module e.g. solar cells based on the bulk heterojunction principle. A double layer electrode (Ag-pattern—PEDOT/PSS) can be constructed by using the method described in EXAMPLE 2.

TABLE 8

| | Description | Pattern used from FIG. 1 | | transmission O.D. | Surface resistance [Ω/square] |
|---|---|---|---|---|---|
| | | type | description | | |
| Control material | | | | | |
| J | Without any photographic treatment | — | — | 0.04 | 500 |
| J | After dipping 10 s in AGFA-GEVAERT ™ CP297 developer | — | — | 0.04 | 620 |
| Invention material | | | | | |
| K | Without any photographic treatment | — | — | 0.06 | 5000 |
| K | After transfer reaction | a | Solid area | 2.20 | 2.9 |
| K | After transfer reaction | b | 1 mm lines, 10 mm spacing | 0.25* | 33 |
| K | After transfer reaction | c | 150 μm lines, 5 mm spacing | 0.12* | 95 |
| K | After transfer reaction | d | No Ag developed | 0.07 | 1300 |

*calculated values

EXAMPLE 5

Application of a Conductive Ag-Pattern Coated with a Patterned Conductive PEDOT/PSS in the Production of Thin Film Solar Cells FIG. 2 shows side (upper) and top (lower) views of a sequential process for building up a module with a separate photovoltaic cell, two serially connected photovoltaic cells and three serially connected photovoltaic cells using a six step process in which:
A=a subbed support
B=a gelatin layer This makes feasible the construction of cells with larger areas, because the charge will be collected in the conductive Ag-network.

EXAMPLE 6

Conceptual experiments were carried out with a recorder film with a gelatine to silver ratio of 0.014. Exposed areas of 1×3 cm² as electrodes with a separation of 40 μm gave conducting silver patterns upon processing by conventional graphic processing. The resulting electrode pattern had a surface resistance of 50 to 100 ohm/square.

These electrodes were conditioned for 3 days at 35° C. and a relative humidity of 80%. The aqueous solutions used for treating the electrodes prior to applying a potential of 100 V between neighbouring electrodes are listed in Table 9.

TABLE 9

| Solution nr. | Solution active ingredient | conc. (%) | solvent |
|---|---|---|---|
| 1 | STAB01 (1-phenyl-5-mercapto-tetrazole) | 1.0 | water* |
| 2 | STAB01 | 0.1 | water* |
| 3 | STAB01 + Antarox ™ CO 630# | 1.0 + 0.5 | water |
| 4 | STAB01 + Antarox ™ CO 630# | 0.1 + 0.5 | water |
| 5 | STAB02 (sodium tartrate) | 10 | water |
| 6 | STAB02 (sodium tartrate) | 1 | water |
| 7 | STAB03 (thiourea) | 10 | water |
| 8 | STAB03 (thiourea) | 1 | water |
| 9 | STAB04 (sodium sulphide) | 10 | water |
| 10 | STAB04 (sodium sulphide) | 1 | water |
| 11 | STAB05 (5-methyl-s-triazolo[1,5-a] pyrimidin-7-ol) | 4.25 | water |
| 12 | STAB05 | 0.425 | water |
| 13 | STAB05 | $1.7 \times 10^{-2}$ | water |
| 14 | STAB05 | $1.7 \times 10^{-4}$ | water |
| 15 | STAB05 | $1.7 \times 10^{-5}$ | water |
| 16 | STAB05 | $1.7 \times 10^{-6}$ | water |
| 17 | STAB06 | 0.5 | water |
| 18 | STAB06 | 0.05 | water |
| 19 | STAB06 | 0.005 | water |
| 20 | STAB07 | 0.5 | water |
| 21 | STAB07 | 0.05 | water |
| 22 | STAB07 | 0.005 | water |
| 23 | STAB08 | 0.5 | water |
| 24 | STAB08 | 0.05 | water |
| 25 | STAB08 | 0.005 | water |
| 26 | STAB09 | 0.5 | water |
| 27 | STAB09 | 0.05 | water |
| 28 | STAB09 | 0.005 | water |
| 29 | PMT01 | 0.1 | ethanol |
| 30 | PMT01 | 0.004 | ethanol |
| 31 | PMT01 | $4 \times 10^{-5}$ | ethanol |
| 32 | PMT01 | $4 \times 10^{-6}$ | ethanol |
| 33 | PMT02 | 0.5 | water |
| 34 | PMT02 | 0.05 | water |
| 35 | PMT02 | 0.005 | water |
| 36 | PMT03 | 0.5 | water |
| 37 | PMT03 | 0.05 | water |
| 38 | PMT03 | 0.005 | water |
| 39 | PMT04 | 0.5 | ethanol |
| 40 | PMT04 | 0.05 | ethanol |
| 41 | PMT04 | 0.005 | ethanol |
| 42 | PMT05 | 0.5 | water |
| 43 | PMT05 | 0.05 | water |
| 44 | PMT05 | 0.005 | water |
| 45 | PMT06 | 0.05 | water |
| 46 | PMT06 | 0.005 | water |
| 47 | PMT07 | 0.05 | water |
| 48 | PMT07 | 0.005 | water |
| 49 | PMT08 | 0.5 | water |
| 50 | PMT08 | 0.05 | water |
| 51 | PMT08 | 0.005 | water |
| 52 | PMT09 | 0.5 | water |
| 53 | PMT09 | 0.05 | water |
| 54 | PMT09 | 0.005 | water |
| 55 | PMT10 | 0.5 | water |
| 56 | PMT10 | 0.05 | water |
| 57 | PMT11 | 0.05 | water |
| 58 | PMT11 | 0.005 | water |
| 59 | PMT12 | 0.05 | water |
| 60 | PMT12 | 0.005 | water |
| 61 | PMT13 | 0.05 | water |
| 62 | PMT13 | 0.005 | water |
| 63 | PMT14 | 0.05 | water |
| 64 | PMT14 | 0.005 | water | a nonyl-phenyl-oxy-polyethyleneglycol (EO 9.5), from GAF

After treatment of the electrodes by dipping in the solution for 1 at 25° C., a potential of 100 V was applied between neighbouring electrodes for 20 minutes. The result was viewed under a microscope and recorded photographically. The gap between the electrodes without pretreatment and before applying a potential was determined to be 43.0±0.7 µm. Tables 10 and 11 record the final gap width and general observations concerning silver dendrite formation after particular pretreatments and the subsequent application of a potential of 100 V for 20 minutes for the comparative experiments with STAB01 to STAB09 and for the invention experiments with PMT01 to PMT14 respectively.

TABLE 10

| Comparative experiment nr. | solution nr. | result of applying 100 V for 20 min. between electrodes | |
|---|---|---|---|
| | | final width of gap [µm] | observations |
| 1# | none | 25.8 ± 1.0 | front formation |
| 2* | none | 28.3 ± 1.0 | front formation |
| 3* | none | 43.1 ± 1.2 | dendrites, but no front formation |
| 4 | 1 | 23.6 ± 1.8 | front formation |
| 5 | 2 | 21.5 ± 2.5 | front formation |
| 6 | 3 | 25.5 ± 2.9 | front formation |
| 7 | 4 | 41.8 ± 0.7 | dendrite formation |
| 8 | 5 | 35.5 ± 1.3 | front formation but loss of electrode contact |
| 9 | 6 | 33.6 ± 1.7 | front formation |
| 10 | 7 | 27.8 ± 1.9 | front formation |
| 11 | 8 | 26.2 ± 2.9 | front formation |
| 12 | 9 | 22.1 ± 4.1 | front formation but loss of electrode contact |
| 13 | 10 | 27.8 ± 2.7 | front formation |
| 14 | 11 | 30.4 ± 1.7 | front formation |
| 15 | 12 | 26.0 ± 1.2 | front formation |
| 16 | 13 | 21.8 ± 2.0 | zones with front formation/ zones with dendrites but no front formation |
| 17 | 14 | 23.5 ± 3.1 / 43.8 ± 0.7 | zones with front formation/ zones with dendrites but no front formation |
| 18 | 15 | 25.7 ± 2.1 / 42.4 ± 1.0 | zones with front formation/ zones with dendrites but no front formation |
| 19 | 16 | 22.6 ± 2.3 | zones with front formation/ zones with dendrites but no front formation |
| 20 | 17 | 28.6 ± 0.6 | front formation |
| 21 | 18 | 26.7 ± 0.6 | front formation |
| 22 | 19 | 43.2 ± 0.6 | dendrites, but no front formation |
| 23 | 20 | 23.4 ± 0.9 | front formation |
| 24 | 21 | 24.9 ± 1.1 | front formation |
| 25 | 22 | 24.6 ± 0.6 | front formation |
| 26 | 23 | 32.2 ± 2.3 | front formation |
| 27 | 24 | 43.3 ± 0.6 | dendrites, but no front formation |
| 28 | 25 | 42.4 ± 1.8 | dendrites, but no front formation |
| 29 | 26 | 42.7 ± 1.7 | dendrites, but no front formation |
| 30 | 27 | 43.1 ± 1.0 | occasional dendrites |
| 31 | 28 | 43.0 ± 0.4 | occasional dendrites | neither conditioning nor solution pretreatment prior to application of 100 V DC
*no solution pretreatment between conditioning and application of 100 V DC

TABLE 11

| Invention experiment nr. | solution nr. | result of applying 100 V for 20 min. between electrodes | |
|---|---|---|---|
| | | final width of gap [µm] | observations |
| 1 | 29 | 41.9 ± 0.7 | almost no dendrite formation |
| 2 | 30 | 42.4 ± 0.7 | almost no dendrite formation |
| 3 | 31 | 41.5 ± 0.4 | almost no dendrite formation |
| 4 | 32 | 41.4 ± 1.1 | occasional dendrites |

TABLE 11-continued

| Invention | | result of applying 100 V for 20 min. between electrodes | |
|---|---|---|---|
| experiment nr. | solution nr. | final width of gap [μm] | observations |
| 5 | 33 | 29.8 ± 0.4 | front formation |
| 6 | 34 | 29.4 ± 1.4 | front formation |
| 7 | 35 | 43.1 ± 0.3 | dendrites, but no front formation |
| 8 | 36 | 42.9 ± 0.4 | occasional dendrites |
| 9 | 37 | 42.6 ± 0.7 | occasional dendrites |
| 10 | 38 | 43.3 ± 0.75 | dendrites, but no front formation |
| 11 | 39 | 42.4 ± 0.8 | almost no dendrite formation |
| 12 | 40 | 43.4 ± 0.7 | occasional dendrites |
| 13 | 41 | 42.4 ± 1.0 | dendrites, but no front formation |
| 14 | 42 | 43.9 ± 0.8 | dendrites, but no front formation |
| 15 | 43 | 43.8 ± 0.6 | almost no dendrite formation |
| 16 | 44 | 44.2 ± 0.4 | almost no dendrite formation |
| 17 | 45 | 42.9 ± 0.7 | dendrites, but no front formation |
| 18 | 46 | 43.4 ± 0.7 | almost no dendrite formation |
| 19 | 47 | 43.5 ± 1.0 | occasional dendrites |
| 20 | 48 | 43.2 ± 0.9 | occasional dendrites |
| 21 | 49 | 25.4 ± 2.3 | front formation |
| 22 | 50 | 43.4 ± 0.8 | occasional dendrites |
| 23 | 51 | 43.7 ± 0.4 | almost no dendrite formation |
| 24 | 52 | 43.3 ± 0.7 | dendrites, but no front formation |
| 25 | 53 | 42.0 ± 0.8 | occasional dendrites |
| 26 | 54 | 43.9 ± 0.5 | almost no dendrite formation |
| 27 | 55 | 24.1 ± 4.0 | front formation |
| 28 | 56 | 42.9 ± 0.9 | dendrites, but no front formation |
| 29 | 57 | 25.6 ± 3.3 | front formation |
| 30 | 58 | 43.0 ± 0.5 | occasional dendrites |
| 31 | 59 | 23.4 ± 3.0 | front formation |
| 32 | 60 | 42.8 ± 0.4 | almost no dendrite formation |
| 33 | 61 | 42.2 ± 0.6 | occasional dendrites |
| 34 | 62 | 41.9 ± 1.2 | occasional dendrites |
| 35 | 63 | 26.1 ± 2.1 | front formation |
| 36 | 64 | 41.6 ± 1.1 | occasional dendrites |

These results show migration of silver ions upon conditioning for 3 days at 35° C. and 80% relative humidity and subsequent application of a potential of 100 V DC for 20 minutes in the absence of pretreatment (comparative experiments 2 and 3). A comparison of the results with comparative experiments 1 and 2 show that conditioning clearly promoted silver dendrite growth as observed in actual devices.

Pretreatment with an aqueous solution of sodium tartrate (STAB02) provided limited restraint as shown by the reduced growth of the silver dendrite front. Pretreatment with high concentrations of sodium sulphide (STAB04) appeared to detach the silver dendrite front from the electrode. Low concentrations of 5-methyl-s-triazolo[1,5-a]pyrimidin-7-ol (STAB05) also restrained silver dendrite growth as evidenced by the break up of the silver dendrite front into clusters of silver dendrites although this was limited to particular zones.

All the 5-mercapto-tetrazoles investigated, with the notable exception of unsubstituted 1-phenyl-5-mercapto-tetrazole [STAB01], also exerted at least a limited restraint on the silver dendrite-formation process as could be seen by at least the appearance of a broken front formed by clusters of silver-dendrites. 1-Phenyl-5-mercapto-tetrazole itself exhibited this behaviour in the presence of the surfactant Antarox™ CO 630, a non-ionic-surfactant. However, substantial restraint was only observed with 1-phenyl-mercapto-tetrazole compounds with the phenyl group substituted with at least one electron accepting group such as halide, acylamino- or amido-groups as shown by the compounds PMT01 to PMT14. Almost complete restraint was observed upon pretreatment with solutions 29, 30, 31, 39, 43, 44, 46, 51, 54 and 60 i.e. with PMT1, PMT05, PMT06, PMT08, PMT09 and PMT12 almost complete restraint was observed at concentrations of 1-phenyl-5-mercapto-tetrazole with phenyl groups substituted with electron accepting groups of 0.005%: or lower.

Experiments in photovoltaic devices consisting of a poly (ethylene terephthalate) support/silver grid/screen-printed PEDOT-PSS-containing paste/poly{[2-methoxy-5-(2'-ethylhexoxy)-p-phenylene]vinylene}:1-(3-methoxycarbonyl)-propyl-1-1-phenyl-(6,6) $C_{61}$ layer/aluminium with and without PMT-1 in the silver grid layer gave the results given in Table 12 upon exposure with a halogen lamp:

TABLE 12

| | $V_{oc}$ [mV] | $I_{sc}$ [mA/cm$^2$] |
|---|---|---|
| without silver grid | 830 | 0.7 |
| silver grid without PMT-1 | 740 | 3.8 |
| silver grid with PMT-1 | 730 | 5.2 |

The results in Table 12 show that the presence of a silver grid increased the short circuit current from 0.7 mA/cm$^2$ to 3.8 mA/cm$^2$ and reduced the open circuit voltage from 830 to 740 V. Furthermore, incorporation of PMT-1 in the silver grid layer increased the short circuit current ($I_{SC}$) still further to 5.2 mA/cm$^2$.

The present invention may include any feature or combination of features disclosed herein either implicitly or explicitly or any generalisation thereof irrespective of whether it relates to the presently claimed invention. In view of the foregoing description it will be evident to a person skilled in the art that various is modifications may be made within the scope of the invention.

Having described in detail preferred embodiments of the current invention, it will now be apparent to those skilled in the art that numerous modifications can be made therein without departing from the scope of the invention as defined in the following claims.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Of course, variations of those preferred embodiments will become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

We claim:

1. A process for preparing a substantially transparent conductive layer configuration on a support, said layer configuration comprising, in any order at least a first layer containing an intrinsically conductive polymer and a second layer consisting of a non-continuous layer of conductive silver, wherein said photographic process comprises the steps of: coating a layer containing silver halide and gelatin with a weight ratio of gelatin to silver halide in the range of 0.05 to 0.3, image-wise exposing said silver halide-containing layer, and developing said exposed silver halide-containing layer to produce said second layer.

2. A process for preparing a substantially transparent conductive layer configuration on a support, said layer configuration comprising in any order at least a first layer containing an intrinsically conductive polymer and a second layer consisting of a non-continuous layer of conductive silver, wherein said photographic process comprises the steps of: coating the support with a layer of a nucleation agent and producing a non-continuous silver layer on said nucleation layer using silver salt diffusion transfer.

3. The process according to claim 2, wherein said process further comprises coating said first layer prior to preparing said second layer by a photographic process.

4. The process according to claim 2, wherein said nucleation agent is palladium sulphide.

5. The process according to claim 1, wherein said intrinsically conductive polymer contains structural units represented by formula (I):

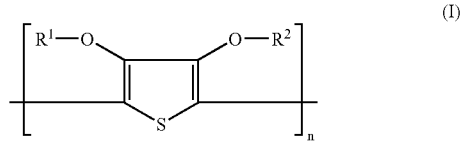

wherein n is larger than 1 and each of $R^1$ and $R^2$ independently represents hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

6. The process according to claim 1, wherein said process further comprises coating said first layer prior to preparing said second layer by a photographic process.

7. A process for preparing a substantially transparent conductive layer configuration on a support, said layer configuration comprising in any order at least a first layer containing an intrinsically conductive polymer and a second layer consisting of a non-continuous layer of conductive silver, wherein said process further comprises coating said first layer upon said second layer comprising a silver pattern.

8. A layer configuration obtained by a process for preparing a substantially transparent conductive layer configuration on a support, said layer configuration comprising in any order at least a first layer containing an intrinsically conductive polymer and a second layer consisting of a non-continuous layer of conductive silver, said process comprising the step of: preparing said second layer by a photographic process, wherein said layer configuration further contains a 1-phenyl-5-mercapto-tetrazole compound in which the phenyl group is substituted with at least one electron accepting group.

9. The layer configuration according to claim 8, wherein said photographic process comprises the steps of: coating a layer containing silver halide and gelatin with a weight ratio of gelatin to silver halide in the range of 0.05 to 0.3, image-wise exposing said silver halide-containing layer, and developing said exposed silver halide-containing layer to produce said second layer.

10. The layer configuration according to claim 8, wherein said photographic process comprises the steps of: coating the support with a layer of a nucleation agent; producing a non-continuous silver layer on said nucleation layer using silver salt diffusion transfer.

11. The layer configuration according to claim 10, wherein said nucleation agent is palladium sulphide.

12. The layer configuration according to claim 8, wherein said intrinsically conductive polymer contains structural units represented by formula (I):

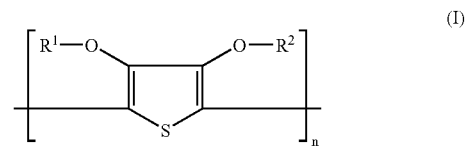

wherein n is larger than 1 and each of $R^1$ and $R^2$ independently represents hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-2}$ alkyl- or phenyl-substituted ethylene group, a 1,3-propylene group or a 1,2-cyclohexylene group.

13. The layer configuration according to claim 8, wherein said process further comprises coating said first layer prior to preparing said second layer by a photographic process.

14. The layer configuration according to claim 8, wherein said process further comprises coating said first layer upon said second layer comprising a silver pattern.

15. A light emitting diode comprising a layer configuration prepared by a process for preparing a substantially transparent conductive layer configuration on a support, said layer configuration comprising in any order at least a first layer containing an intrinsically conductive polymer and a second layer consisting of a non-continuous layer of conductive silver, said process comprising the step of preparing said second layer by a photographic process, wherein said process further comprises coating said first layer upon said second layer comprising a silver pattern.

16. The light emitting diode according to claim 15, wherein said photographic process comprises the steps of: coating a layer containing silver halide and gelatin with a weight ratio of gelatin to silver halide in the range of 0.05 to 0.3, image-wise exposing said silver halide-containing layer, and developing said exposed silver halide-containing layer to produce said second layer.

17. The light emitting diode according to claim 15, wherein said photographic process comprises the steps of: coating the support with a layer of a nucleation agent and producing a non-continuous silver layer on said nucleation layer using silver salt diffusion transfer.

18. The light emitting diode according to claim 17, wherein said nucleation agent is palladium sulphide.

19. The light emitting diode according to claim 15, wherein said intrinsically conductive polymer contains structural units represented by formula (I):

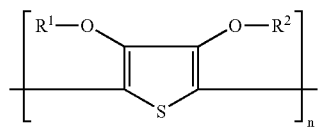

(I)

wherein n is larger than 1 and each of $R^1$ and $R^2$ independently represents hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

20. The process according to claim 2, wherein said intrinsically conductive polymer contains structural units represented by formula (I):

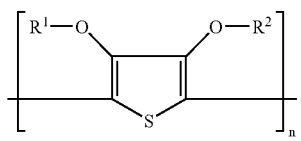

(I)

wherein n is larger than 1 and each of $R^1$ and $R^2$ independently represents hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

21. The process according to claim 7, wherein said intrinsically conductive polymer contains structural units represented by formula (I):

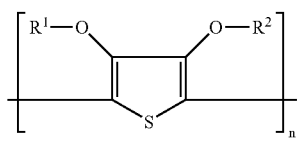

(I)

wherein n is larger than 1 and each of $R^1$ and $R^2$ independently represents hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

22. A photovoltaic device comprising a layer configuration prepared by a process for preparing a substantially transparent conductive layer configuration on a support, said layer configuration comprising in any order at least a first layer containing an intrinsically conductive polymer and a second layer consisting of a non-continuous layer of conductive silver, said process comprising the step of: preparing said second layer by a photographic process.

23. The photovoltaic device according to claim 22, wherein said photographic process comprises the steps of coating a layer containing silver halide and gelatin with a weight ratio of gelatin to silver halide in the range of 0.05 to 0.3, image-wise exposing said silver halide-containing layer, and developing said exposed silver halide-containing layer to produce said second layer.

24. The photovoltaic device according to claim 22, wherein said photographic process comprises the steps of: coating the support with a layer of a nucleation agent producing a non-continuous sliver layer on said nucleation layer using silver salt diffusion transfer.

25. The photovoltaic device according to claim 24, wherein said nucleation agent is palladium sulphide.

26. The photovoltaic device according to claim 22, wherein said intrinsically conductive polymer contains structural units represented by formula (I):

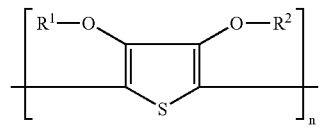

(I)

wherein n is larger than 1 and each of $R^1$ and $R^2$ independently represents hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

27. The photovoltaic device according to claim 22, wherein said process further comprises coating said first layer prior to preparing said second layer by a photographic process.

28. The photovoltaic device according to claim 22, wherein said process further comprises coating said first layer upon said second layer comprising a silver pattern.

29. A transistor comprising a layer configuration prepared by a process for preparing a substantially transparent conductive layer configuration on a support, said layer configuration comprising in any order at least a first layer containing an intrinsically conductive polymer and a second layer consisting of a non-continuous layer of conductive silver, said process comprising the step of: preparing said second layer by a photographic process.

30. The transistor according to claim 29, wherein said photographic process comprises the steps of: coating a layer containing silver halide and gelatin with a weight ratio of gelatin to silver halide in the range of 0.05 to 0.3, image-wise exposing said silver halide-containing layer, and developing said exposed silver halide-containing layer to produce said second layer.

31. The transistor according to claim 29, wherein said photographic process comprises the steps of: coating the support with a layer of a nucleation agent; producing a non-continuous silver layer on said nucleation layer using silver salt diffusion transfer.

32. The transistor according to claim 31, wherein said nucleation agent is palladium sulphide.

33. The transistor according to claim 29, wherein said intrinsically conductive polymer contains structural units represented by formula

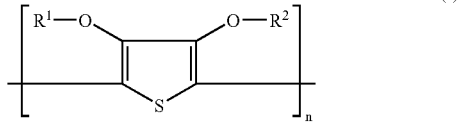

wherein n is larger than 1 and each of $R^1$ and $R^2$ independently represents hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

34. The transistor according to claim 29, wherein said process further comprises coating said first layer prior to preparing said second layer by a photographic process.

35. The transistor according to claim 29, wherein said process further comprises coating said first layer upon said second layer comprising a silver pattern.

36. An electroluminescent device comprising a layer configuration prepared by a process for preparing a substantially transparent conductive layer configuration on a support, said layer configuration comprising in any order at least a first layer comprising an intrinsically conductive polymer and a second layer consisting of a non-continuous layer of conductive silver, said process comprising the step of preparing said second layer by a photographic process, wherein said process further comprises coating said first layer upon said second layer comprising a silver pattern.

37. The electroluminescent device according to claim 36, wherein said photographic process comprises the steps of: coating a layer containing silver halide and gelatin with a weight ratio of gelatin to silver halide in the range of 0.05 to 0.3, image-wise exposing said silver halide-containing layer, and developing said exposed silver halide-containing layer to produce said second layer.

38. The electroluminescent device according to claim 36, wherein said photographic process comprises the steps of: coating the support with a layer of a nucleation agent; producing a non-continuous silver layer on said nucleation layer using silver salt diffusion transfer.

39. The electroluminescent device according to claim 38, wherein said nucleation agent is palladium sulphide.

40. The electroluminescent device according to claim 36, wherein said intrinsically conductive polymer contains structural units represented by formula (I):

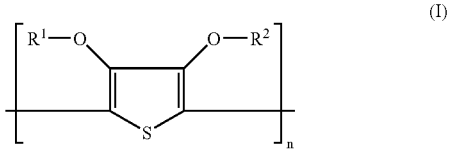

wherein n is larger than 1 and each of $R^1$ and $R^2$ independently represents hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

41. A light emitting diode comprising a layer configuration prepared by a process for preparing a substantially transparent conductive layer configuration on a support, said layer configuration comprising in any order at least a first layer containing an intrinsically conductive polymer and a second layer consisting of a non-continuous layer of conductive silver, said process comprising the step of: preparing said second layer by a photographic process, wherein said photographic process comprises the steps of: coating the support with a layer of a nucleation agent and producing a non-continuous silver layer on said nucleation layer using silver salt diffusion transfer.

42. The light emitting diode according to claim 41, wherein said process further comprises coating said first layer prior to preparing said second layer by said photographic process.

43. The light emitting diode according to claim 41, wherein said nucleation agent is palladium sulphide.

44. The light emitting diode according to claim 41, wherein said intrinsically conductive polymer contains structural units represented by formula (I):

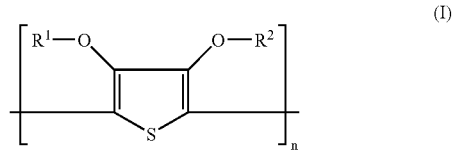

wherein n is larger than 1 and each of $R^1$ and $R^2$ independently represents hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

45. The light emitting diode according to claim 41, wherein said process further comprises coating said first layer prior to preparing said second layer by a photographic process.

46. An electroluminescent device comprising a layer configuration prepared by a process for preparing a substantially transparent conductive layer configuration on a support, said layer configuration comprising in any order at least a first layer containing an intrinsically conductive polymer and a second layer consisting of a non-continuous layer of conductive silver, said process comprising the step of: preparing said second layer by a photographic process, wherein said photographic process comprises the steps of: coating the support with a layer of a nucleation agent and producing a non-continuous silver layer on said nucleation layer using silver salt diffusion transfer.

47. The electroluminescent device according to claim 46, wherein said process further comprises coating said first layer prior to preparing said second layer by a photographic process.

48. An electroluminescent device comprising a layer configuration prepared by a process for preparing a substantially transparent conductive layer configuration on said support, said layer configuration comprising in any order at least a first layer comprising an intrinsically conductive polymer and a second layer consisting of a non-continuous layer of conductive silver, said process comprising the step of preparing said second layer by a photographic process, wherein said photographic process comprises the steps of: coating a layer containing silver halide and gelatin with a weight ratio of gelatin to silver halide in the range of 0.05 to 0.3, image-wise exposing said silver halide-containing layer, and developing said exposed silver halide-containing layer to produce said second layer.

49. The electroluminescent device according to claim 46, wherein said nucleation agent is palladium sulphide.

50. The electroluminescent device according to claim 46, wherein said intrinsically conductive polymer contains structural units represented by formula (I):

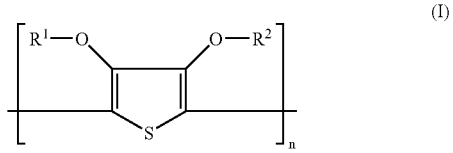

wherein n is larger than 1 and each of $R^1$ and $R^2$ independently represents hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

51. The electroluminescent device according to claim 46, wherein said process further comprises coating said first layer prior to preparing said second layer by a photographic process.

52. A light emitting diode comprising a layer configuration prepared by a process for preparing a substantially transparent conductive layer configuration on a support, said layer configuration comprising in any order at least a first layer containing an intrinsically conductive polymer and a second layer consisting of a non-continuous layer of conductive silver prepared by a process comprising a photographic process, wherein said photographic process comprises the steps of: coating a layer containing silver halide and gelatin with a weight ratio of gelatin to silver halide in the range of 0.05 to 0.3, image-wise exposing said silver halide-containing layer, and developing said exposed silver halide-containing layer to produce said second layer.

* * * * *